(12) United States Patent
Weems, II et al.

(10) Patent No.: US 8,085,517 B2
(45) Date of Patent: Dec. 27, 2011

(54) APPARATUS AND METHOD FOR GROUND FAULT DETECTION AND LOCATION IN ELECTRICAL SYSTEMS

(76) Inventors: Warren A. Weems, II, Avondale, AZ (US); Russsell L. Kincaid, Milford, NH (US); Wayne L. Green, Glendale, AZ (US)

(*) Notice: Subject to any disclaimer, the term of this patent is extended or adjusted under 35 U.S.C. 154(b) by 0 days.

(21) Appl. No.: 12/435,395

(22) Filed: May 4, 2009

(65) Prior Publication Data

US 2009/0256576 A1    Oct. 15, 2009

Related U.S. Application Data

(63) Continuation-in-part of application No. 11/504,095, filed on Aug. 10, 2006, now Pat. No. 7,529,069, which is a continuation-in-part of application No. 10/709,146, filed on Apr. 16, 2004, now abandoned, which is a continuation-in-part of application No. 10/215,310, filed on Aug. 8, 2002, now Pat. No. 6,844,736.

(51) Int. Cl.
*H02H 9/08* (2006.01)
*G01R 31/28* (2006.01)
(52) U.S. Cl. ........... 361/42; 324/528; 324/529; 324/530
(58) Field of Classification Search .................. 361/42; 324/528–530
See application file for complete search history.

(56) References Cited

U.S. PATENT DOCUMENTS

| | | | | |
|---|---|---|---|---|
| 2,651,021 A | * | 9/1953 | Hays, Jr. | 324/529 |
| 4,884,034 A | * | 11/1989 | Guzman | 324/529 |
| 5,714,885 A | * | 2/1998 | Lulham | 324/529 |
| 6,154,036 A | * | 11/2000 | Baldwin | 324/509 |

* cited by examiner

*Primary Examiner* — Jared Fureman
*Assistant Examiner* — Scott Bauer
(74) *Attorney, Agent, or Firm* — Wright Law Group, PLLC; Mark F. Wright

(57) ABSTRACT

The present invention is implemented by deploying an enhanced ground fault detection and location apparatus and by using the apparatus in conjunction with specific circuit analysis methods, using the information generated by the ground fault detection and location apparatus. The ground fault detection and location apparatus comprises the functionality of a voltmeter, an ammeter, a phase angle meter, a frequency generator, and a variable power supply, thereby providing for a variety of signals and analyses to be performed on a unintentionally grounded circuit in an ungrounded AC or DC power distribution system. The ground fault detection and location apparatus is capable of operating in six different modes, with each mode providing a different capability or opportunity for detecting, analyzing, and locating one or more unintentionally grounded circuits in an normally ungrounded AC or DC power distribution system. Additionally, the present invention is configured to manipulate a ground fault current at a first target frequency and a second target frequency, thereby enabling more rapid and efficient location of ground faults.

9 Claims, 9 Drawing Sheets

APPARATUS AND METHOD FOR GROUND FAULT DETECTION AND LOCATION IN ELECTRICAL SYSTEMS

RELATED APPLICATIONS

This application is a continuation-in-part of U.S. patent application Ser. No. 11/504,095 filed on Aug. 10, 2006now U.S. No. 7,529,069, which application is a continuation-in-part of U.S. patent application Ser. No. 10/709,146 filed on Apr. 16, 2004 now abandoned, which application is now abandoned, which application is a continuation-in-part of U.S. patent application Ser. No. 10/215,310 filed on Aug. 8, 2002, which application is now issued as U.S. Pat. No. 6,844,736, all of which are incorporated herein by reference.

BACKGROUND OF THE INVENTION

1. Field of the Invention

The present invention relates generally to detecting and locating ground faults in ungrounded electrical distribution systems and more particularly relates to detecting and locating ground faults without de-energizing the system.

2. Background Art

Most electrical distributions systems that are used to supply power to various types of equipment and machinery are designed as either "grounded" or "ungrounded" systems. A "ground fault" is an undesirable condition in an electrical distribution system, where the electrical current in the system flows or "leaks" outside of its intended flow path. Grounded electrical distribution systems are typically designed so that any electrical ground faults will trip one or more circuit breakers, thereby shutting down the electrical distribution system before any serious damage to people or equipment can occur. Electrical faults in most ungrounded electrical distribution systems will typically not shut the system down but will, instead, result in the generation of an alarm, thereby providing an alert while maintaining any critical loads in an energized condition. For this reason, an ungrounded electrical distribution system may offer increased reliability as a power source when compared to a grounded electrical distribution system.

Undesirable and unintended ground faults on ungrounded electrical distribution systems can result from many several different situations. For example, some major failures in electric equipment are caused by insulation breakdowns. Over time, the insulation on the electrical cables or wires can degrade, thereby exposing the conductors to other conducting materials, resulting in an unintentional grounding. Other types of failures that may introduce ground faults include circuit board failures, excess moisture being introduced into the electrical distribution system, bad wire joints and sleeves, leaking batteries, accidental grounds caused during testing, component failure, etc.

In most ungrounded electrical distribution systems, any ground fault that results in a detectable current flow due to faulted component in the system will activate a ground fault detection device (typically located at the main distribution bus), thereby alerting the operators of the electrical distribution system to the presence of the ground fault. Once detected, best practices dictate that the ground fault be located and eliminated so as to minimize the possibility of damage or harm to electrical equipment or human beings.

A typical ground fault detection circuit consists of a pair of resistors joined in series with the connection point between the two resistors being tapped, with the tap being connected to ground. This series combination of the resistors with a center tap is generally added in parallel to all of the other loads on the electrical distribution system. The use of such standard ground fault detectors in electrical distribution systems is well-known to those skilled in the art and, accordingly, is not discussed in greater detail herein.

Even more important and generally far more difficult than ground fault detection is the problem of ground fault location. While a ground fault detection system may accurately reveal that a ground fault exists on a given ungrounded electrical distribution system, the task of pinpointing the exact location of the ground fault is typically far more difficult to accomplish. Failure to quickly locate and rectify a ground fault may lead to equipment failure, inadvertent exposure to dangerous electrical environments, and other undesirable outcomes including reduction or termination of production or, in extreme cases, plant outages.

While it is important to locate ground faults as quickly and efficiently as possible, certain practical realities can complicate this task. For example, many circuits suffer from frequency induced "noise." In these circuits, if a ground fault current at a normally detectable current level is present but yet lower in magnitude than the background noise on the electrical distribution system, traditional ground fault location equipment may not be able to distinguish between the actual ground fault and the ambient noise on the circuit. The result will be an inability to locate the circuit containing the ground fault. Accordingly, many traditional ground fault locating devices are be incapable of locating high resistance ground faults due to either a low amount of ground fault current, excessive noise on the system, or a combination of both.

In addition, with many large ungrounded AC electrical distribution systems, the lengths of the cable used in the distribution system can add capacitive reactance to the circuit. These long distribution runs, being capacitive in nature, can impede current flow in certain circuits, effectively creating the appearance of a ground fault where there is none. This can make the location of the actual ground fault far more difficult in some electrical distribution systems.

In addition to the capacitive resistance found in some systems, other electrical distribution systems sensitive equipment being fed by an ungrounded system, there may be capacitors used intentionally so as to create a path to ground. This situation is different than the capacitive resistance associated with long cable runs that coincidentally form capacitive paths to ground in that these are intentional pathways to ground. These capacitors are designed to be active only if there is any change in the current within a specific frequency range, such as background noise, on the power supply feeding certain sensitive equipment. If the background noise is in the targeted frequency range, it will be shunted to ground and back to the ground detector and to the source. This design provides the sensitive equipment with a much "cleaner" power supply and may be found on both AC and DC systems.

In other circumstances, intermittent, cycling or momentary ground faults or multiple ground faults on an ungrounded electrical distribution system may occur. An intermittent ground fault results from a ground fault occurring in electrical equipment during a specific operation but not in any specific time cycle. In an industrial setting, various types of equipment may periodically cycle between "on" and "off." If this equipment also contains a ground fault, the detector will only sense the fault when the equipment is in the "on" position but not in the "off" position. During the time that the technician is investigating the ground fault, the strength of the ground fault may change or the ground may become intermittent, cycling or momentary stopping altogether, consequently making the entire location effort difficult if not futile. Similarly, other ground faults may be hidden in control circuit operations and may occur only during the transitory operation of a single switch.

Presently known portable ground fault locating techniques used on uninterruptible systems supplying vital loads typically attempt to locate the circuit containing the ground fault in one of two ways. First, by causing the ground fault current to vary in magnitude thereby providing a signal that can be detected by a Hall Effect sensor. The variation of the ground current may include the interruption of the ground current, in effect cycling the ground current from its full magnitude and then to zero, and then back again, thereby creating a "pulse." These systems are only marginally effective and then only in conjunction with DC systems. Other devices may be deployed in similar fashion and may use a current transformer to detect the pulse.

In the second scenario for ground fault location, a separate signal (typically in the 30 Hz range) is "injected" as an artificial ground fault detection voltage signal. In these systems, the signal generator is coupled to the network at a first particular network location and generates for each line of the network an individual non-DC ground fault detection voltage signal between such line and ground. A current transformer or Hall Effect device is then used as a sensor to sense either the associated ground fault current changes or the artificially injected signal, systematically on every circuit of the system, until the circuit containing the ground fault has been located. This approach is very time consuming and leads to a great deal of "trial and error" searching, hoping to stumble across the appropriate branch circuit where the ground fault is located.

Thus, while certain techniques are available for detecting and locating ground faults in normally ungrounded electrical distribution systems, present systems and methods are suboptimal due to the inherent limitations in both the equipment and techniques known to those skilled in the art. Accordingly, it would be an improvement in the art to augment or even replace current equipment and techniques for both ground fault detection and location.

SUMMARY OF THE INVENTION

The present invention is implemented by deploying an enhanced ground fault detection and location apparatus and by using the apparatus in conjunction with specific circuit analysis methods, using the information generated by the ground fault detection and location apparatus. The ground fault detection and location apparatus comprises the functionality of a voltmeter, an ammeter, a phase angle meter, a frequency generator, and a variable power supply, thereby providing for a variety of signals and analyses to be performed on a unintentionally grounded circuit in an ungrounded AC or DC power distribution system. The apparatus includes a main unit and a remote or secondary unit, which is most preferably a portable hand-held unit.

The ground fault detection and location apparatus is capable of operating in six different modes, with each mode providing a different capability or opportunity for detecting, analyzing, and locating one or more unintentionally grounded circuits in an normally ungrounded AC or DC power distribution system. In the first mode, the ground fault detection and location apparatus is in the de-energized state and the ground fault detection and location apparatus is non-operational. In the second mode, data about the system voltage being monitored by the ground fault detection and location apparatus is displayed on a screen and the information may be used for analyzing a specific situation. In the third and forth modes, the ground fault detection and location apparatus can be used to detect ground faults and provide additional data to help the user of the ground fault detection and location apparatus gain additional insight into the operational characteristics of the electrical system being monitored by ground fault detection and location apparatus. By switching to a fifth and/or sixth mode, the ground fault detection and location apparatus of the present invention can be used to locate ground faults in a rapid and efficient fashion.

The most preferred embodiments of the present invention employ methods of detecting and locating one or more unintentionally grounded circuits in a normally ungrounded AC or DC power distribution system using the main unit to detect and analyze ground faults and using the secondary unit" for sensing current manipulations introduced onto the circuit by main unit. The main unit displays various voltage, current, and phase angle measurements related to the flow of electricity in the circuit. Additionally, the main unit is configured to manipulate the ground fault current at two specific frequencies. Using the ground fault location sensing unit, a technician will then search for the manipulated ground fault current on individual branch circuits until the manipulated current is discovered on the faulted branch circuit by deploying one or more secondary sensing units. The secondary unit also acts as an analyzing tool and therefore by analyzing the branch circuit-level response to the ground fault current manipulation, the specific location of the ground fault or faults can be more readily ascertained, thereby promoting rapid and efficient repair and recovery practices. The components and circuits of the apparatus of the present invention may be also be implemented as a dedicated, permanent ground fault detector device installation. It is anticipated that the various preferred embodiments of the present invention will find application in a wide variety of industries and locations including maritime and naval operations, mining operations, large manufacturing operations such as paper mills, hospitals, transmission substations and power plants, etc.

BRIEF DESCRIPTION OF THE DRAWINGS

In order that the manner in which the above recited and other features and advantages of the present invention are obtained, a more particular description of the invention will be rendered by reference to specific embodiments thereof, which are illustrated in the appended drawings. Understanding that the drawings depict only exemplary embodiments of the present invention and are not, therefore, to be considered as limiting the scope of the invention, the preferred embodiments of present invention will be described and explained with additional specificity and detail through the use of the accompanying drawings wherein like designations denote like elements and.

DETAILED DESCRIPTION OF THE INVENTION

Figure 1:
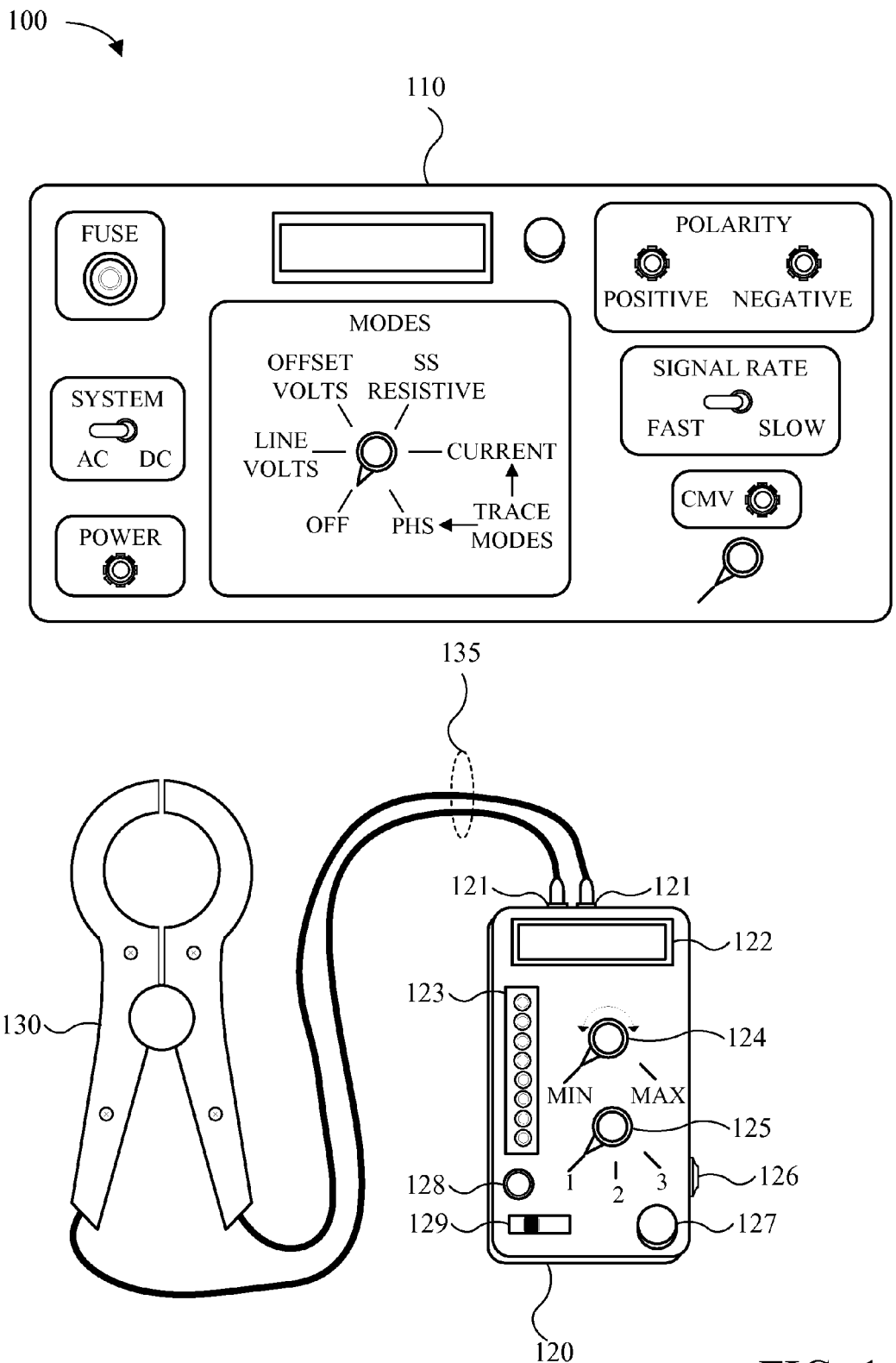
FIG. 1 is a schematic diagram of an apparatus for detecting and locating ground fault currents in accordance with a preferred embodiment of the present invention.

The apparatus and methods of the most preferred embodiments of the present invention are configured to combine ground fault detection principles, ground fault location principles, circuit isolation principles, and current transformer principles to systematically detect and locate the source of a ground fault on an ungrounded electrical distribution system. The various preferred embodiments of the present invention provide for enhanced ground fault detection, monitoring, and evaluating methods using a permanently mounted detector relay and a separate detection/location device that can be deployed as a portable ground fault detection and location system or as a permanently or semi-permanently mounted ground fault detection and location system.

In addition, it should be noted that the terms "electrical system," electrical distribution system" and "system" may be used herein to refer to practically any ungrounded electrical system, including ungrounded alternating current (AC) electrical systems and ungrounded direct current (DC) electrical systems. Similarly, whether the AC system operates at 60 hertz (American system) or 50 hertz (European system), the apparatus and methods described herein are applicable. In general, these various references to "systems" refer to practically any ungrounded electrical system designed or used for the distribution and utilization of electrical power in commercial as well as industrial applications. This includes systems owned and/or operated by and for governments, public and private utilities, as well as general business operations and enterprises.

One preferred embodiment of the present invention comprises a permanently mounted ground fault detection device that will detect a ground fault and assist the technician or operator in the effort to determine the extent of the fault condition, whether the detected ground fault is a "hard" or "soft" ground, an intermittent ground, or a cycling ground. Further system troubleshooting methods and techniques described herein can be employed to locate the specific component or components that have created the ground fault.

In addition, at least one preferred embodiment of the permanent version of the present invention combines an ANSI device 64 with an ANSI device 27 and ANSI device 59 to provide under/over-voltage protection and ground fault protection within the same device. In this fashion, the apparatus of the present invention may be used to replace existing equipment while providing enhanced ground fault detection and location capabilities, thereby enhancing the robustness of the ungrounded electrical distribution system and the protection thereof.

In addition to detecting/locating ground faults, it is contemplated that one or more of the preferred embodiments of the present invention will provide alarm contacts that will actuate when the source voltage goes below or above a settable value. Additionally, a programmable time delay for the operation of the alarm contacts will be provided in at least one preferred embodiment of the present invention. Finally, in at least one preferred embodiment of the present invention, a communication interface mechanism will be provided, enabling the alarm sensors to be connected to an external monitoring system. The output from the alarm sensors will be proportional to the ground current and offset voltage detected by the system, thereby allowing for various graduated responses to be driven by the detected output.

Alternative preferred embodiments of the present invention also provide for a portable ground fault detection and location system that may be temporarily connected to an ungrounded electrical distribution system or branch circuit thereof on an "as-needed" basis. The portable system may be used to detect a ground fault when it occurs, to provide data that may allow an evaluation of the risk to vital equipment associated with the circuit containing the ground fault, and to locate the circuit or component that has caused the ground fault. This is true regardless of the specific nature of the ground fault or even in conjunction with an ungrounded system that suffers from multiple simultaneous ground faults. Because this preferred embodiment of the present invention is portable, the same techniques used to locate the circuit that contains the ground fault may also be used to locate the specific component that has faulted to ground.

Accordingly, the systems and methods of the most preferred embodiments of the present invention provide the capability to detect and locate a grounded circuit on an ungrounded AC or DC system without de-energizing the circuit. Once the grounded circuit has been located, troubleshooting can be performed to isolate and repair or replace the grounded component. These and other features and advantages of the present invention will be set forth or will become more fully apparent in the description that follows and in the appended claims. The features and advantages may be realized and obtained by means of the instruments and combinations particularly pointed out in the appended claims. Furthermore, the features and advantages of the invention may be learned by the practice of the invention or will be further understood from the description, as set forth hereinafter.

Referring now to FIG. 1, a block diagram of a ground fault detection and location apparatus 100 in accordance with a preferred embodiment of the present invention is shown. As shown in FIG. 1, apparatus 100 most preferably comprises a ground fault main unit 110; a ground fault location sensor 120; and a current transformer 130.

Ground fault main unit 110 comprises a series of components, circuits, controls and interface elements that, taken together, provide a unique design for the detection and location of ground faults in a normally ungrounded AC or DC system. In the most preferred embodiments of the present invention, ground fault main unit 110 will also comprise a ground fault detector that is substantially similar to a typical ANSI device function 64. By including the functionality of this ground fault detector, preliminary information regarding ground faults can be assessed by ground fault main unit 110.

Additional descriptive information about ground fault main unit 110 is presented below in conjunction with FIG. 2A.

Ground fault location sensor 120 comprises a series of components, circuits, controls, and interface elements that can be used to monitor and interpret various signals provided by ground fault main unit 110 and an electrical distribution system. Additionally, by providing various types of feedback to a technician or to ground fault main unit 110, ground fault location sensor 120 can be used to analyze an electrical distribution system to quickly and accurately locate ground faults in an ungrounded AC or DC electrical distribution system.

The input operating parameters for the most preferred embodiments of ground fault detection and location apparatus 100 are 24V DC-250V DC and 70V AC-170 V AC. Additionally, ground fault detection and location apparatus 100 is housed in a durable housing and will not produce sparks and is designed to work in both extreme hot and cold environments.

Ground fault location sensor 120 is most preferably a handheld unit that can be coupled to current transformer 130 and used in conjunction with ground fault main unit 110 to locate ground faults in an ungrounded electrical distribution system. The most preferred embodiments of ground fault location sensor 120 comprise: a pair of input jacks 121; a display 122; a signal strength indicator bank 123; a strength indicator adjustment knob 124; a range selector knob 125; a low frequency button 126; a power indicator 128; and an "on-off" power switch 129. Ground fault location sensor 120 may be selectively coupled to current transformer 130, via leads 135. In at least one preferred embodiment of the present invention, ground fault main unit 110 and ground fault location sensor 120 may be combined into a single unit.

Input jacks 121 are used to connect ground fault location sensor 120 to current transformer 130, thereby providing an input signal from current transformer 130 to ground fault location sensor 120 via leads 135. Input jacks 121 are sized and configured to accept the probe leads from current transformer 130, thereby allowing the probe leads to be selectively inserted into input jacks 121. Those skilled in the art will recognize the input jacks 121 may be any type of connection device suitable for the purposes described herein. For example, input jacks 121 may be implemented as a Bayonet Nut Connector (BNC) type fitting or other similar connector. This type of connector is considered safer for certain applications and will be used as appropriate for the specific application when necessary or desired. Additionally, certain preferred embodiments of the present invention may include a locking mechanism to prevent the inadvertent disconnection of the probe leads from input jacks 121.

Display 122 is most preferably a digital readout or display that provides visual feedback to the operator of ground fault location sensor 120. Depending on the mode of operation, display 122 will display various types of information relative to the circuit readings being provided by current transformer 130. The most preferred embodiments of the present invention at least display the magnitude of the ground current in milliamps.

Signal strength indicator 123 is most preferably a bank of LEDs that are used to indicate the strength of the signal received by ground fault location sensor 120, from current transformer 130. The stronger the signal, the more LEDs that will be lit up. If signal strength indicator 123 indicates a weak signal, the technician or operator may choose to make adjustments to ground fault main unit 110, thereby boosting the ground fault current to enhance the possibility of locating the ground fault. Additionally, it would be possible to adjust the sensitivity of ground fault location sensor 120, by using strength indicator adjustment knob 124. If necessary, both techniques may be used.

Strength indicator adjustment knob 124 is provided to adjust the relative sensitivity of the bank of LEDs that comprise signal strength indicator 123. By rotating strength indicator adjustment knob 124 from the "min" setting to the "max" setting, the sensitivity or "pick up" range for ground fault location sensor 120 is re-calibrated for the lower signal strength, thereby adjusting the signal level that will activate the bank of LEDs that comprise signal strength indicator 123. Depending on the operational range selected for ground fault location sensor 120, it may be necessary or desirable to adjust the sensitivity of ground fault location sensor 120 so as to generate visible output from the LEDs that comprise signal strength indicator 123.

Range selector knob 125 is provided to allow the operator of ground fault location sensor 120 to adjust the range for current readings sensed and displayed by current transformer 130. In the most preferred embodiments of the present invention, there are at least three different settings for range selector knob 125. The middle setting will be used in normal operational mode with 1 LED from the bank of LEDs that comprise signal strength indicator 123 being the equivalent of 1.0 mA. The other two ranges would be used for signals that are in a range that is greater or lesser than the middle range. For example, in the lower setting, 1 LED from the bank of LEDs that comprise signal strength indicator 123 would be the equivalent of 0.1 mA and in the higher setting, 1 LED from the bank of LEDs that comprise signal strength indicator 123 would be the equivalent of 10.0 mA.

Low frequency button 126 is provided to allow the operator of ground fault location sensor 120 to temporarily adjust ground fault location sensor 120 to respond to a second, lower frequency target ground current oscillation for diagnostic purposes, thereby providing a diagnostic capability that may be useful to determine whether or not the correct circuit has been located by current transformer 130. Whenever low frequency button 126 is depressed, ground fault location sensor 120 will operate in a lower frequency mode, using 0.5 Hz as the target current frequency. By alternatively depressing and releasing remote control switch 126, and matching the target frequency with main unit 110, the user can verify that the grounded circuit, and corresponding ground fault, has been located.

Meter hold button 127 is provided as a means to temporarily "freeze" the current information presented by display 122. When the operator of ground fault location sensor 120 presses meter hold button 127, whatever is displayed by display 122 will remain visible until the operator of ground fault location sensor 120 presses meter hold button 127 a second time. This function allows the operator of ground fault location sensor 120 to capture intermediate and transitory results for more detailed analysis.

Power indicator 128 is most preferably an LED that is used to indicate when ground fault location sensor 120 is energized and functioning properly. Provided that ground fault location sensor 120 is provided with appropriate power, power indicator 128 will be illuminated. In certain preferred embodiments of the present invention, power indicator 128 may also be illuminated based on the successful completion of one or more diagnostic checks for ground fault location sensor 120 that are initiated upon the activation of ground fault location sensor 120. Should ground fault location sensor 120 fail the diagnostics on the power-up sequence, power indicator 128 may be configured to blink, thereby alerting the user of ground fault location sensor 120 that there has been a malfunction with the device.

Power switch 129 is provided to turn ground fault location sensor 120 on and off. To use ground fault location sensor 120, power switch 129 is moved to the "on" position. When not in use, power switch 129 is moved to the "off" position, thereby conserving the power source contained within ground fault location sensor 120. In the most preferred embodiments of the present invention, power or "on-off" switch 129 is a simple switch that provides activation of the internal energy supply for ground fault location sensor 120. Ground fault location sensor 120 is most preferably powered by internal batteries but an external power supply could be utilized as well.

Current transformer 130 may be any standard current transformer known to those skilled in the art. Coupled with hand-held ground fault location sensor 120, current transformer 130 may be used to locate ground fault currents in an electrical distribution system. In the most preferred embodiments of the present invention, current transformer 130 is a hand-held device with "clip-on" or "clamp-on" jaws that allow the current-sensing portion of current transformer 130 to be placed around the wires of a circuit without de-energizing the circuit and then removed when the tasks associated with locating the ground fault have been completed. Those skilled in the art will recognize that multiple sizes of clamp-on jaws may be deployed for the various sizes of circuits that may be investigated.

In a more permanent installation, current transformer 130 would be a "split-core" style current transformer that can be installed around the wires of the circuit that needs to be monitored without the need of disconnecting or de-energizing the circuit. Once installed and positioned at the desired circuit location, current transformer 130 can simply be left in place for future continual or periodic monitoring, as desired.

Those skilled in the art will recognize that alternative means may be employed to indicate the presence of an electrical current oscillating at the desired frequency. For example, an audio signal could be used instead of or in addition to the LED to indicate the strength of the signal provide to ground fault location sensor 120, from current transformer 130. In this case, the decibel level of the audio signal could be increased to correspond to the strength of the signal.

Figure 2:
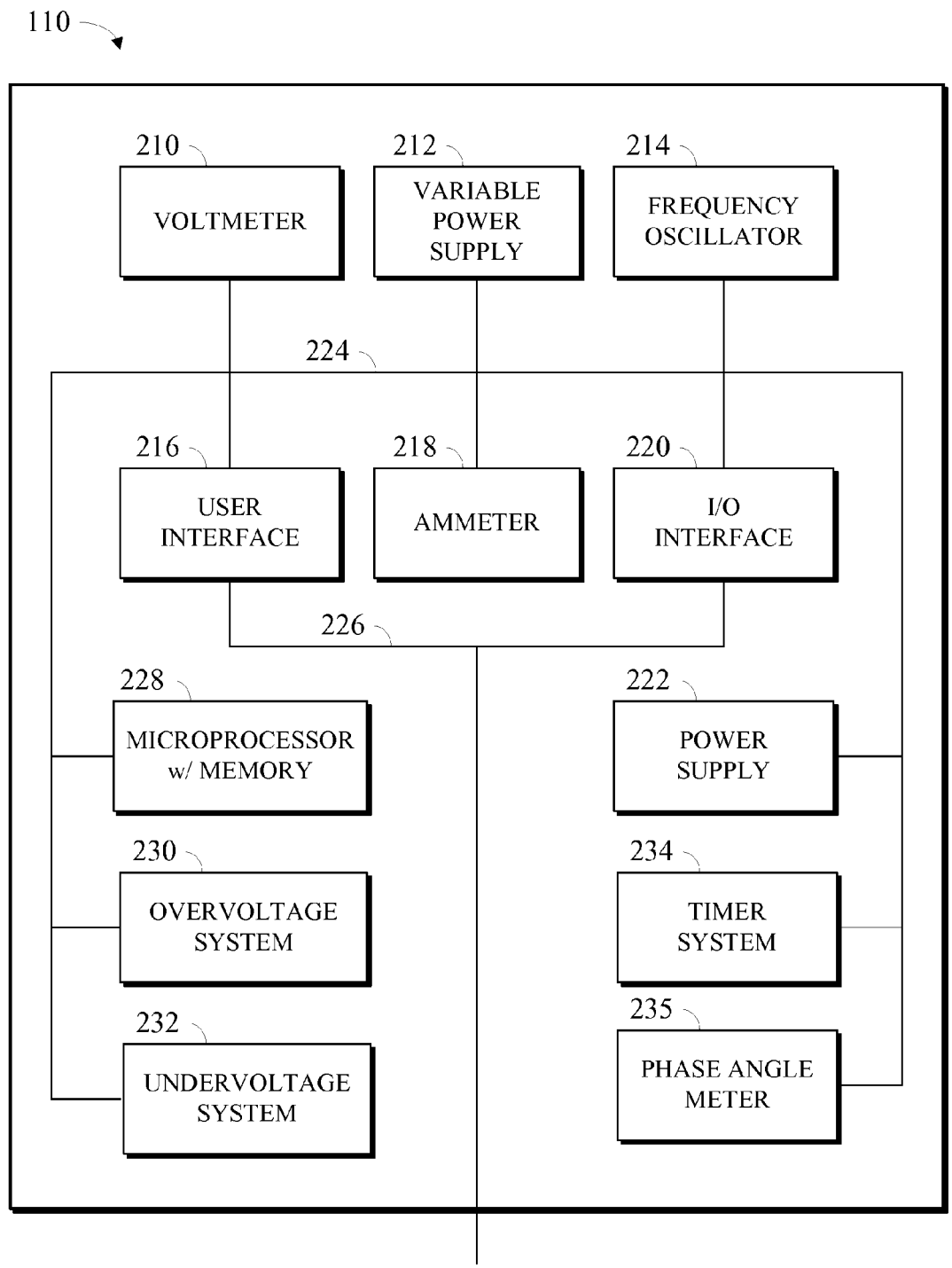
FIG. 2 is a block diagram of a ground fault apparatus main unit in accordance with a preferred embodiment of the present invention.

Referring now to FIG. 2, a schematic block diagram of a ground fault main unit 110 in accordance with a preferred embodiment of the present invention comprises a voltmeter 210; a variable power supply or Common Mode Voltage (CMV) source 212; a frequency oscillator 214; a user interface 216; an ammeter 218; an I/O interface 220; a phase angle meter 235; and a power supply 222 all connected via internal signal bus 224. These components are generally included in the most preferred embodiments of the present invention for portable applications. Additionally, external bus 226 is provided for transmitting and receiving signals to and from external devices or sources. External bus 226 is any communication media capable of transmitting signals and providing a communication to other devices using any suitable communication protocol or technology known to those skilled in the art, including wireless communication technologies. In certain preferred embodiments of the present invention, additional optional components such as an overvoltage detection system 230; an under voltage detection system 232; and a timer system 234 may also be included. These components would be considered applicable in a permanently or semi-permanently installed embodiment of the present invention.

Voltmeter 210 is not a standalone voltmeter in the traditional sense but is a collection of circuits that are configured to provide the functionality of a voltmeter within ground fault main unit 110 and in conjunction with the operation of apparatus 100 of FIG. 1. By selectively activating the voltmeter functions of voltmeter 210, various voltage-related signals associated with the unintentionally grounded circuit can be detected and/or monitored, thereby providing an opportunity for troubleshooting and eventually locating the ground fault.

Variable power supply 212 is capable of producing a wide range of outputs, providing an opportunity to increase oscillations in the ground fault current to levels that will be more detectable in the field by a technician using ground fault location sensor 120 ground fault location sensor 120 of FIG. 1. If the ground fault current is not detectable due to high resistance, then the amount of power supplied by variable power supply 212 can be increased, thereby increasing the level of ground fault current flowing in the circuit until the technician using ground fault location sensor 120 of FIG. 1 can detect the oscillations in the circuit where ground fault location sensor 120 has been clamped.

Frequency oscillator 214 is a frequency generator that is capable of manipulating a current, causing it to oscillate at the "target" frequency. For the most preferred embodiments of the present invention, there will be at least two "target frequencies" used for oscillation purposes. The first target frequency is 2.0 Hz and the second target frequency is 0.5 Hz. Those skilled in the art will recognize that many other frequencies may be generated by frequency oscillator 214 and that 2.0 Hz and 0.5 Hz have been suggested for use in at least one preferred embodiment of the present invention but the present invention embraces the use of alternative frequencies, including frequencies in the range of 0.25 Hz to 10 Hz.

User interface 216 represents various dials, lights, meters, use and system communication messages, etc. that are provided in conjunction with ground fault main unit 110 to provide feedback to the user of ground fault main unit 110 regarding the operation of the various components of ground fault main unit 110, thereby providing an opportunity for troubleshooting and eventually locating the ground fault.

Ammeter 218 is not a standalone ammeter in the traditional sense but is a collection of circuits that are configured to provide the functionality of an ammeter within ground fault main unit 110 and in conjunction with the operation of ground fault detection and location apparatus 100 of FIG. 1. By selectively activating the ammeter functions of ammeter 218, various current-related signals associated with the unintentionally grounded circuit can be detected, thereby providing an opportunity for troubleshooting and locating the ground fault.

I/O interface 220 represents various connections that provide an interface point for receiving or transmitting various signals to and from ground fault main unit 110 and other devices. For example, I/O interface 220 may be used to connect a standard chart recorder to ground fault main unit 110, thereby providing the opportunity to create a paper-based record of certain activities related to the operation of ground fault main unit 110 such as a representation of the magnitude of the ground fault current. In alternative preferred embodiments of the present invention, I/O interface 220 may comprise a Universal Serial Bus (USB) port, thereby providing an interface to standard computer systems. This embodiment will be most valuable in permanent installations where a central processing unit (CPU) is used to control the functions of ground fault detection and location apparatus 100 of FIG. 1.

Power supply 222 is the power source for ground fault main unit 110, providing power to the various components of ground fault main unit 110, via internal system bus 224. In the most preferred embodiments of the present invention, power supply 222 is actually a power source that is connected to and powered by the ungrounded electrical distribution system being monitored by ground fault main unit 110. In at least one other preferred embodiment of the present invention, power supply 222 is an uninterruptible power supply (UPS) that is fed with a battery backup system. This allows for maximum robustness of power supply 222 and can prevent or reduce the possibility of power loss. Those skilled in the art will recognize that many other types of power sources may be deployed as power supply 222, based upon the specific application and environment. Additionally, as previously mentioned, in certain preferred embodiments of the present invention, ground fault location sensor 120 may also be powered from ground fault main unit 110, via communication a link (not shown this FIG.).

Phase angle meter 235 is not a standalone phase angle meter in the traditional sense but is a collection of circuits that are configured to provide the functionality of a phase angle meter within ground fault main unit 110 and in conjunction with the operation of ground fault detection and location apparatus 100 of FIG. 1. Phase angle meter 235 is configured to measure and display the phase angle (0°-90°) between the current and the voltage as detected by ground fault main unit 110. The phase angle measurement is used for diagnostic purposes and is helpful in the ground location process.

In the most preferred embodiments of the presenting invention, internal signal bus 224 is a typical hardwired, multi-drop bus. However, those skilled in the art will recognize that any connection means that supports bi-directional communication in a computer-related environment could be used.

Microprocessor or central processing unit (CPU) 228 will be incorporated into certain alternative preferred embodiments of the present invention, particularly in those installations of a ground fault detection and location apparatus 100 of FIG. 1 that are considered permanent or semi-permanent installations. For these alternative preferred embodiments of the present invention, CPU 228 will be a programmable control unit that will be programmed to perform ground fault detection and location activities on a scheduled and/or automated basis. CPU 228 will typically include a memory portion such as Random Access Memory (RAM). CPU 228 performs computation and control functions). CPU 228 may comprise a single integrated circuit, such as a microprocessor, or may comprise any suitable number of integrated circuit devices and/or circuit boards working in cooperation to accomplish the functions of a processor or CPU.

Additional optional components over-voltage detection system 230, under-voltage detection system 232, and timer system 234 may also be included to add additional functionality to ground fault detection and location apparatus 100 via the enhanced functionality of ground fault main unit 110. In the most preferred embodiments of the present invention, under-voltage detection system 232 and is compliant with ANSI standard 27 and over-voltage detection system 230 is compliant with ANSI standard 59 for over-voltage. Similarly, timer system 234 is compliant with ANSI standard 62. Timer system 234 is provided to offer any affected switchgear with a time to recover from any out of voltage situation. These components are considered to be part of any permanent or semi-permanent installation of ground fault main unit 110 but may not be included in any portable application.

Figure 2A:
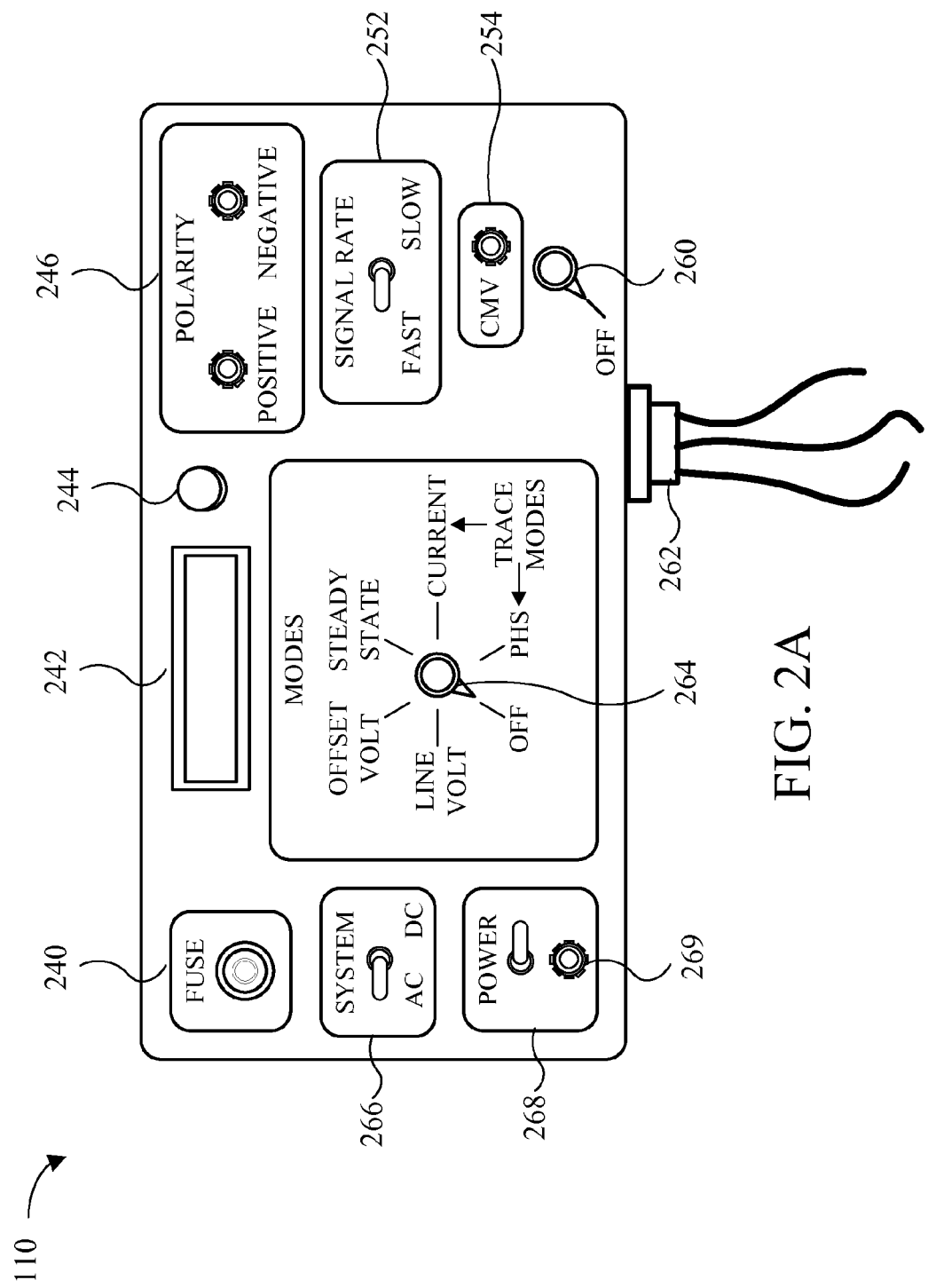
FIG. 2A is a schematic diagram of the operational controls for a ground fault main unit in accordance with a preferred embodiment of the present invention.

Referring now to FIG. 2A, the various controls and displays associated with ground fault main unit 110, are depicted on a schematic diagram of a front panel for ground fault main unit 110. The various controls and displays associated with ground fault main unit 110, are used to set and adjust the functions of ground fault main unit 110 and to provide feedback to the operator of ground fault main unit 110, thereby assisting in the analyzing, detection, and location of ground faults in an ungrounded AC or DC power distribution system.

Ground fault main unit 110 comprises: a fuse 240; a display 242; a confirmation button 244; a polarity indicator 246; a frequency rate control switch 252; a common mode voltage (CMV) indicator light 254; a CMV control switch 260; an Amphenol connector and associated connection wires 262; a mode selector switch 264; a system selector switch 266; and an on/off switch 268 with LED indicator 269.

Fuse 240 is provided as a protection for ground fault detection and location apparatus 100 of FIG. 1 and ground fault main unit 110. Should excess current be transmitted to ground fault main unit 110, fuse 240 will short out, thereby electrically disconnecting apparatus 100 of FIG. 1 and ground fault main unit 110 from the ungrounded electrical distribution system.

Display 242 is provided to offer a visual indication to the operator of ground fault detection and location apparatus 100 of FIG. 1 regarding the voltage, current, and phase angle parameters of the ungrounded electrical system being monitored by ground fault detection and location apparatus 100 of FIG. 1. Since part of the troubleshooting methodology for locating ground faults in accordance with a preferred embodiment of the present invention includes the manipulation of the existing ground fault current, display 242 can be an important part of the location process. The voltage measurements and current measurements displayed on display 242 provide information that can assist in analyzing the severity of a ground fault and offer insight on possible location of circuits or components causing the ground fault. For example, by utilizing the line voltage and offset voltage measurements in conjunction with Thevenin's theorem, the Thevenin resistance can be calculated and the point in the field device where the ground fault originates can be calculated as a percentage of the total resistance of the field device.

Confirmation button 244 is provided to temporarily disconnect the ground current being oscillated or manipulated by ground fault main unit 110 so as to provide further confirmation that the correct branch circuit has been located. As long as confirmation button 244 is depressed by the operator of ground fault main unit 110, the ground current being oscillated by frequency oscillator 214 of FIG. 2 will be removed from the ungrounded electrical distribution system being monitored by ground fault detection and location apparatus 100 of FIG. 1. By temporarily disabling the oscillation of the current in the ungrounded electrical distribution system, ground fault location sensor 120 can be used to detect the changes in the current, thereby facilitating the location of the ground fault. This is particularly useful for screening out "false positives" due to noise in the circuit. When depressing confirmation button 244, the oscillating signal can be removed from consideration and if ground fault location sensor 120 no longer senses the signal, then the technician has reasonable confirmation that the signal is not just noise.

Polarity indicator 246 indicates whether the polarity of the leakage current is on the positive or negative side of the circuit. When the leakage current is on the positive side, the positive LED will be illuminated and when the leakage current is on the negative side, the negative LED will be illuminated.

Frequency rate control switch 252 is used to switch the frequency of the ground current being oscillated by frequency oscillator 214 of FIG. 2 from a first frequency to a second, slower frequency. In the most preferred embodiments of the present invention, the first frequency is in the range of 1.5 Hz to 2.5 Hz with 2 Hz being the most preferred. The second frequency is in the range of 0.25 Hz to 1.5 Hz with 0.5 Hz being the most preferred. When ground fault main unit 110 is being operated in the slower frequency mode, an audible signal will be produced by ground fault main unit 110, thereby alerting the operator of ground fault main unit 110 that ground fault main unit 110 is operating at the slower frequency.

Common mode voltage (CMV) indicator light 254 is provided to indicate whenever ground fault main unit 110 is operating in CMV mode, meaning that variable power supply 212 of FIG. 2 has been activated and is being used to provide more gain in the ground current amplitude.

CMV control switch 260 is used to control the CMV level for ground fault detection and location using ground fault main unit 110. In the most preferred embodiments of the present invention, the voltage range is approximately 0.0V-200V DC. In at least one preferred embodiment of the present invention, CMV control switch 260 must be turned completely to the "off" position prior to engaging variable power supply 212 of FIG. 2. This is a safety feature to ensure that variable power supply 212 of FIG. 2 is not engaged at a high voltage level output.

Amphenol connector and circuit connections 262 are provided to connect ground fault main unit 110 to the positive and negative legs (or "hot" and "common" leg for an AC system) and ground of an ungrounded electrical distribution system, with one circuit connection 262 being connected to the respective legs and ground, thereby removably integrating ground fault main unit 110 into the ungrounded electrical distribution system. In the most preferred embodiments of the present invention, a pair of internal balanced resistors (not shown this FIG.) will be placed between circuit connections 262. The magnitude of the voltage across each of the internal balanced resistors can be monitored by connecting voltmeter 210 of FIG. 2 to a center tap between the balanced resistors, thereby enabling ground fault detection as set forth in conjunction with FIG. 5 below.

System selector switch 266 is provided to configure ground fault main unit 110 for use with either AC or DC ungrounded electrical distribution systems. By selecting the appropriate position, ground fault main unit 110 can be used to detect and locate ground faults in either type of system. This feature is not offered by ground fault location and detection systems known to those skilled in the art since presently known systems are typically offered only for either or an AC system or a DC system.

Mode selector switch 264 is, most preferably, a 6-position switch that can be turned to any position and, depending on the selected position, used to operate ground fault main unit 110 in several different modes in order to quickly and efficiently detect and locate ground faults in an ungrounded electrical distribution system. Mode selector switch 264 is provided to switch ground fault main unit 110 of FIG. 1 from one mode of operation to another for detecting, analyzing, and location purposes once a ground fault is detected or suspected. The functionality for each of the modes is described below and schematic circuit diagrams depicting the implementation for each mode are presented in FIG. 2B, FIG. 2C, FIG. 2D, and FIG. 2E.

In the first or "off" mode, ground fault main unit 110 is de-energized and no operational features are active.

In the second or "line volt" mode, ground fault main unit 110 is energized and LED 269 is illuminated. LED 269 will remain illuminated for each of the modes except the first or "off" mode. In the line volt mode, voltmeter 210 of FIG. 2 is used to measure the line to line voltage for either AC or DC voltage in the ungrounded electrical distribution system being monitored, depending on the position of system selector switch 266. This will allow a measurement of the system voltage. The line voltage is displayed on display 242 in the correct polarity. Any AC voltage reading is displayed using the RMS value.

Figure 5:
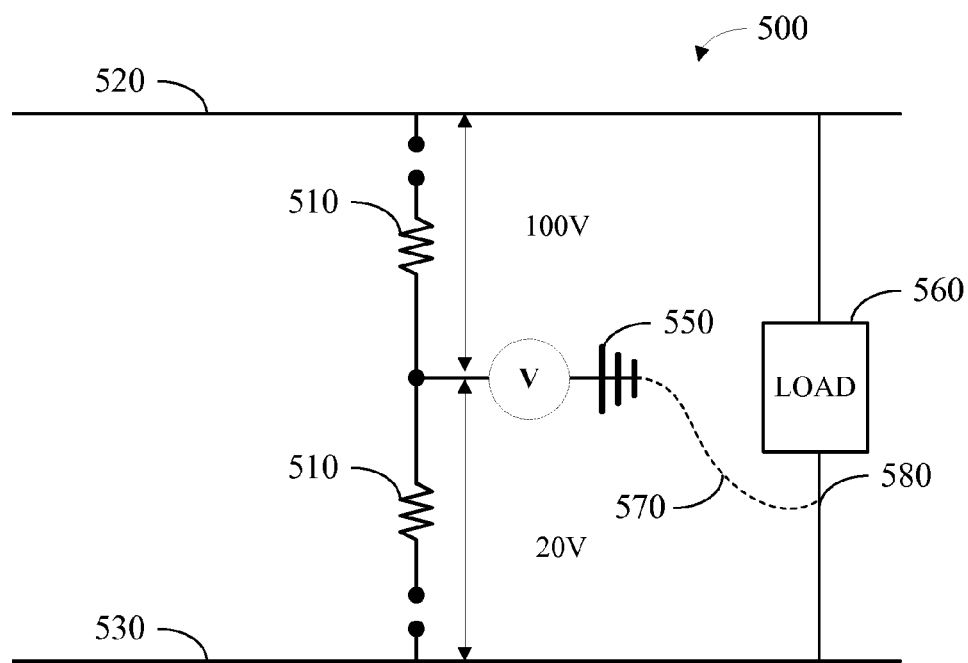
FIG. 5 illustrates a ground fault detection system suitable for use in conjunction with a preferred embodiment of the present invention.

In the third or "offset volt" mode, voltmeter 210 of FIG. 2 is used to measure the voltage from the center of resistors 510 of FIG. 5 to ground. This measurement will allow a determination as to whether the ground fault has occurred on the positive or negative side of the circuit and will be useful to determine the nature of the ground fault, possible locations for the ground fault, as well as potential risk exposure for the equipment connected to the ungrounded electrical distribution systems as a whole, based on the magnitude of the offset voltage. The displayed measurement is connected in reverse polarity to display 242. This setting is also used to set the polarity switch for the next operational mode, the "steady state" mode.

In the fourth or "steady state" mode, ammeter 218 of FIG. 2 is used to measure the ground current when CMV knob 260 of FIG. 2 is turned fully counterclockwise from its initial locked or "off" position. As previously explained, in the most preferred embodiments of the present invention, CMV knob 260 of FIG. 2 is essentially disabled until it is engaged at the lowest possible level, so as to avoid any inadvertent damage due to high voltage output. With CMV knob 260 of FIG. 2 in the lowest level, the ground current being measure is the ground current without any oscillation being provided by variable power supply 212 of FIG. 2. Once engaged, CMV knob 260 of FIG. 2 can be rotated to achieve the desired voltage output. At this point in time, one of polarity indicator LEDs 246 will be illuminated, depending on which side of the line is grounded. The positive or negative LED 246 will be solidly illuminated, with the brilliance of the illuminated LED being proportional to the magnitude of the fault current in the ungrounded electrical distribution system being monitored. In the most preferred embodiments of the present invention, the amount of current reaching ground fault main unit 110 is limited by an internal 10K resistor. For AC current, the peak value will be displayed on display 242. Once the CMV source has been activated in this mode, it will remain operational in modes 5 and 6.

In the fifth or "current" mode, the ground current is oscillated as a SINE wave, using frequency oscillator 214 of FIG. 2. In this mode of operation, ground fault location sensor 120 can be used to locate circuits that are being oscillated at the target frequency. Display 242 displays the amount of current flowing through the ground leakage as measured by ammeter 218 of FIG. 2. As previously mentioned, the CMV source is already on and CMV knob 260 has already been moved clockwise from the "off" position, thereby providing for oscillation of the ground current. As previously explained, one of polarity LEDs 246 will also be illuminated, depending on which side of the circuit is grounded. The positive or negative LED 246 will be solidly illuminated, with the brilliance of the illuminated LED being proportional to the magnitude of the fault current in the ungrounded electrical distribution system being monitored. The illuminated LED will blink at the frequency rate of the current being applied. For the most preferred embodiments of the present invention, this will be either 2.0 Hz or 0.5 Hz.

In the sixth or "Phase" mode, the ground current is, once again, oscillated as a SINE wave, using frequency oscillator 214 of FIG. 2. Display 242 will display the phase angle between the voltage and the ground current, as measured by phase angle meter 235 of FIG. 2. As previously mentioned, the CMV source is already on and CMV knob 260 has already been moved from the "off" position, which is most preferably the fully counterclockwise position. As previously explained, one of polarity LEDs 246 will also be illuminated, depending on which side of the circuit is grounded. The positive or negative LED 246 will be solidly illuminated, with the brilliance of the illuminated LED being proportional to the magnitude of the fault current in the ungrounded electrical distribution system being monitored. This is limited by the internal 10K resistor. The illuminated LED will blink at the frequency rate of the ground current being oscillated. For the most preferred embodiments of the present invention, this will be either 2.0 Hz or 0.5 Hz. The meter will read from zero to +90. The phase meter always reads positive, whether the phase is leading or lagging. The phase angle measurement will be relative to all capacitance on the system at the oscillation frequency. The closer that the phase angle measurement is to zero, the less capacitance will be considered a factor.

When a ground fault current is to be located, voltmeter 210 is bypassed and the ground fault current is oscillated by using frequency oscillator 214 of FIG. 2. If the magnitude of the ground fault current as measured by ammeter 218 is too low to be considered locatable, variable power supply 212 can be used to amplify the magnitude of the ground fault current by increasing the voltage output associated with the induced oscillating ground current. This variable voltage source is known as "Common Mode Voltage" or CMV. While there are many possible choices for the oscillation frequency, the most preferred embodiments of the present invention will employ at least two frequencies in the range of 0.25 Hz to 10 Hz, with 0.5 Hz and 2.0 Hz being the most preferred frequencies. These frequencies have been selected to provide the most reliable location system possible and to enhance the probability of locating the ground fault. Higher frequencies tend to be clustered in the same range as common circuit noise, thereby masking the actual ground fault current and making it more difficult to locate the ground fault current. Additionally, due to the capacitance phenomenon, the use of higher frequencies is generally considered to less desirable for the various preferred embodiments of the present invention. In general, the higher the frequency, the lower the capacitive reactance of capacitive paths and the more false positives will be seen by the sensor.

In addition to the components described above, an optional handle or strap (not shown this FIG.) may be attached to ground fault detection and location apparatus 100 of FIG. 1 for transporting ground fault main unit 110 from one location to another. While ground fault detection and location apparatus 100 of FIG. 1 may be deployed as a permanent installation, it is also anticipated that ground fault detection and location apparatus 100 of FIG. 1 may also be deployed as a portable system, used in a variety of locations as the need arises. The optional carrying handle or strap may be constructed of any appropriate material, with durability and lightweight being desirable material characteristics.

Other optional features including chart recorder terminals may be provided to control the starting and stopping of a chart recorder (not shown this FIG.) that may be connected to ground fault main unit 110. This feature will allow for recordation of certain events, based on the occurrence of any one of a series of pre-determined events. Once an event of interest (e.g., ground fault) is detected, a signal is generated by ground fault main unit 110 and transmitted to a chart recorder and the chart recorder will be activated. Any chart recorder suitable for use in a ground fault current monitoring application may be deployed in conjunction with the various preferred embodiments of the present invention. The tracking of ground fault currents and other events in this fashion allows for the detection of intermittent ground faults and "cycling" ground faults, along with time of occurrence and duration of the event, all which will typically prove very useful in a diagnostic scenario.

Those skilled in the art will recognize that the specific representations presented in conjunction with the description of FIG. 2A are merely illustrative in nature and are not limiting or exhaustive. Additionally, the exact placement, size shape, etc. of the controls depicted in FIG. 2A are not to be interpreted as limiting in nature but serve as examples of one specific preferred embodiment of the present invention. Accordingly, many deviations for preferred exemplary embodiment shown in FIG. 2A are contemplated as being within the scope of the present invention. For example, it is anticipated that certain preferred embodiments of the present invention may replace switches with levers, meters with gauges, buttons with switches, etc. Any such substitutions are encompassed in the various preferred embodiments of the present invention.

Figure 2B:
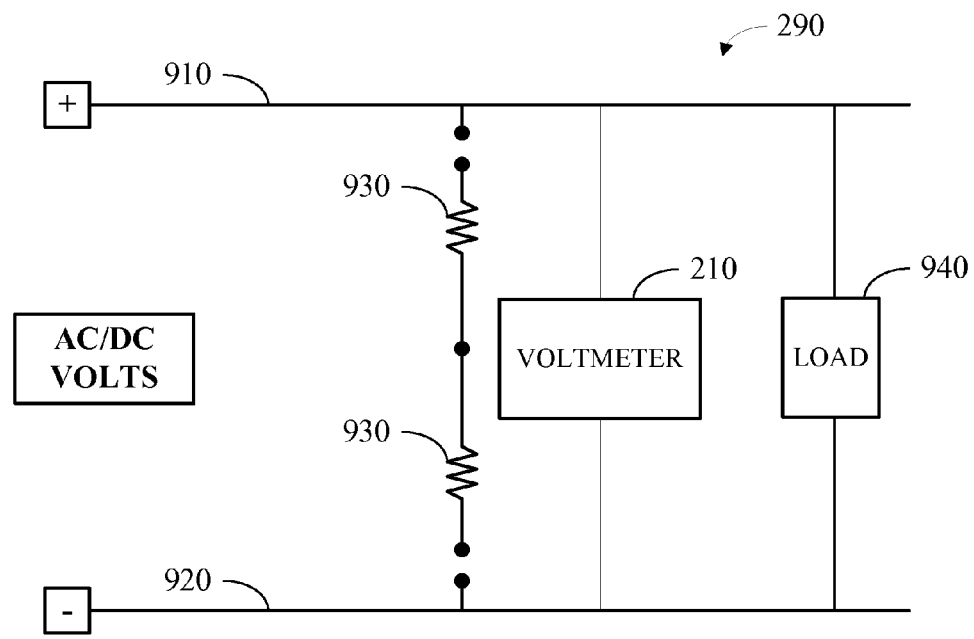
FIG. 2B is a schematic circuit diagram for a specific operational mode of a ground fault main unit in accordance with a preferred embodiment of the present invention.

Referring now to FIG. 2B, a schematic diagram 290 for operating ground fault main unit 110 in the "line volt" mode is depicted. As shown in FIG. 2B, a load 940 is connected between the positive leg 910 and negative leg 920 of circuit 290. In addition, main unit 110 is also connected between positive leg 910 and negative leg 920 of circuit 290, with voltmeter of 210 of FIG. 2 being connected and configured so that the line voltage can be measured by main unit 110 and displayed by display 242 of FIG. 2A. Two resistors 930 are also connected in series, between positive leg 910 and negative leg 920 of circuit 290. This configuration is used for DC circuit analysis.

Figure 2C:
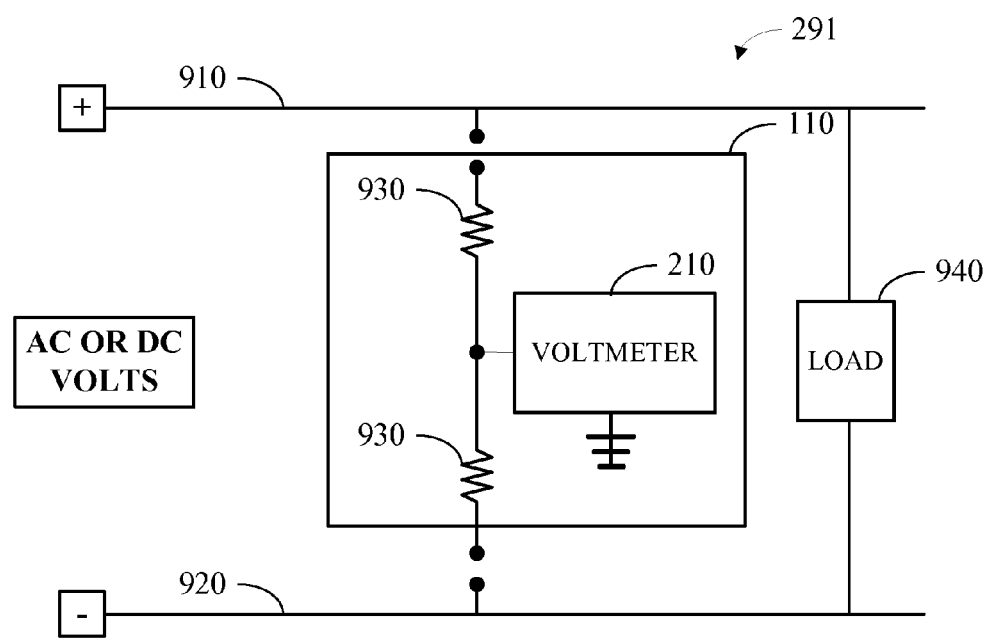
FIG. 2C is a schematic circuit diagram for a specific operational mode of a ground fault main unit in accordance with a preferred embodiment of the present invention.

Referring now to FIG. 2C, a schematic diagram 291 for operating ground fault main unit 110 in the "offset volt" mode is depicted. As shown in FIG. 2C, a load 940 is connected between the positive leg 910 and negative leg 920 of circuit 290. Additionally, voltmeter 210 is connected at the center tap of resistors 930 which are also connected in series, between positive leg 910 and negative leg 920, which is connected to structural steel or some similar grounding point. The magnitude of the offset voltage measured by voltmeter 210 will provide some indication of how close the ground is towards one end of the load. The polarity of the voltage will indicate if the ground is more positive or more negative and, depending on the polarity, the appropriate LED 246 will be illuminated. The polarity will also be retained for use in the next step. This configuration is used for AC or DC circuit analysis.

Figure 2D:
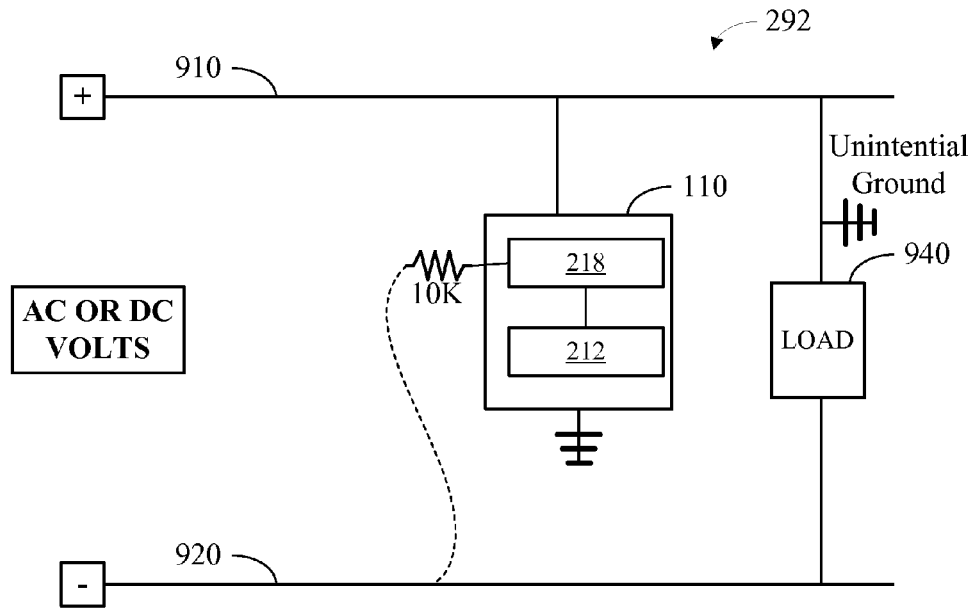
FIG. 2D is a schematic circuit diagram for a specific operational mode of a ground fault main unit in accordance with a preferred embodiment of the present invention.

Referring now to FIG. 2D, a schematic diagram 292 for operating ground fault main unit 110 in the "steady state" mode is depicted. As shown in FIG. 2D, a load 940 is connected between the positive leg 910 and negative leg 920 of circuit 290. In addition, main unit 110 is connected between the positive leg 910 and negative leg 920 of circuit 290. In the steady state mode, the polarity of the ground, from the previous off-set voltage mode is used to introduce a 10K resistor between ammeter 218 and the line with the polarity that is the opposite of the polarity of the ground fault current. In this case, since the unintentional ground is on the positive side of the circuit, the 10K resistor is connected to the negative side of the circuit. This mode is used for AC or DC circuit analysis.

Figure 2E:
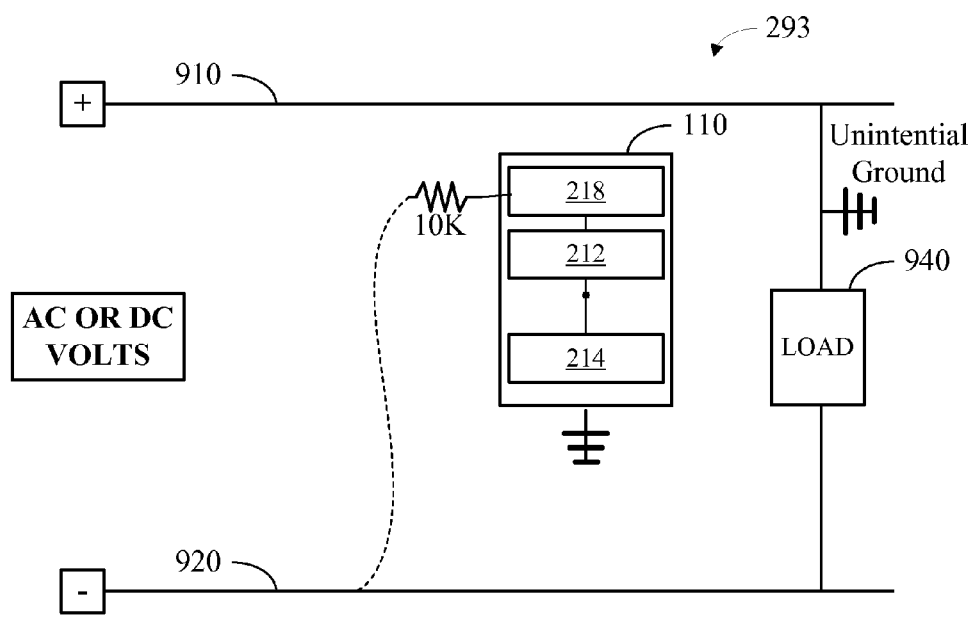
FIG. 2E is a schematic circuit diagram for a specific operational mode of a ground fault main unit in accordance with a preferred embodiment of the present invention.

Referring now to FIG. 2E, a schematic diagram 293 for operating ground fault main unit 110 in "current" mode is depicted. Current mode is a "trace mode" and is the first mode used for actual location of the ground fault. As shown in FIG.

2E, a load 940 is connected between the positive leg 910 and negative leg 920 of circuit 290. In addition, main unit 110 is connected between the positive leg 910 and negative leg 920 of circuit 290. Ammeter 218, and frequency oscillator 214, and variable CMV power source 221 are also part of the circuit. This mode is used for AC or DC circuit analysis.

Figure 3:
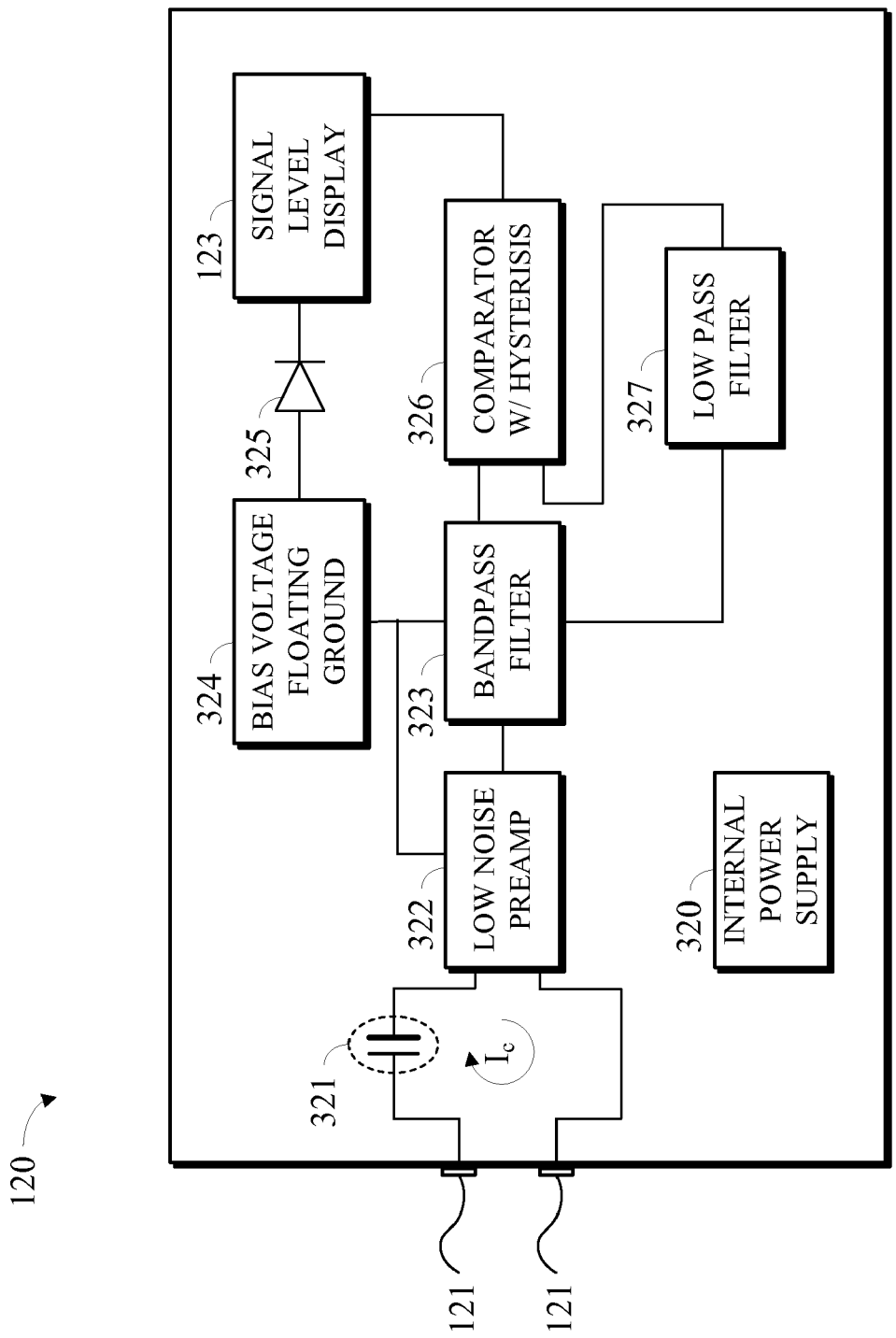
FIG. 3 is a block diagram of a ground fault location apparatus in accordance with a preferred embodiment of the present invention.

Referring now to FIG. 3, a block diagram of hand-held ground fault location sensor 120 of FIG. 1 is shown. One of the most preferred embodiments of ground fault location sensor 120 comprises: one or more input jacks 121; an internal power supply 320; a resonating capacitor 321; a low noise preamp 322; a band-pass filter 323; a bias voltage floating ground 324; a diode 325; a comparator 326; a low-pass filter 327; signal level display 328; and LED 124.

As shown in FIG. 3, input jacks 121 are provided for inserting the probe leads for a standard current transformer, such as current transformer 130 of FIG. 1 (not shown this FIG.). Once the probe leads of the current transformer 130 are inserted into input jacks 121, hand-held ground fault location sensor 120 may be used in conjunction with portable ground system 110 of FIG. 1 (not shown this FIG.) to locate ground faults in an electrical distribution system.

Internal power supply 320 is any suitable power source that may be used to provide power to the various components of ground fault location sensor 120. Internal power supply 320 is connected via an internal bus or distribution system (not shown this FIG.) to provide power to the various components of ground fault location sensor 120. In the most preferred embodiments of the present invention, internal power supply 320 comprises one or more disposable batteries such as a 9V battery or a pair of AA batteries. These sizes of batteries are readily available and allow for easy replacement of power supply 320 as necessary. By deploying common replaceable batteries for internal power supply 320, ground fault location sensor 120 becomes a portable and easily transported device that can be used in the ground fault current detection process. Depending on the specific application, other preferred embodiments may utilize less commonly available power sources, such as solar powered batteries, fuel cells, etc. Additionally, a battery charger, similar to a cell phone batter charger, could be utilized.

While the most preferred embodiments of the present invention embrace a hand-held ground fault location sensor 120, those skilled in the art will recognize that power supply 320 may also be implemented as a more permanent connection to a more robust power supply for a permanent or semi-permanent installation. A more robust power supply would become the power source for those preferred embodiments of the present invention that embrace a permanent ground fault detection system with multiple ground fault location monitors employed on multiple branch circuits, thereby providing continuous monitoring and location capabilities for detecting and eliminating ground fault currents.

Resonating capacitor 321 works in concert with a feedback resistor contained in low-noise preamp 322 to enhance the input signal introduced into ground fault location sensor 120 from current transformer 130 via input jacks 121. The overall effect created with resonating capacitor 321 is to allow the CT to operate at a frequency as low as possible instead of the typical 20-30 Hz minimum response frequency. The circulating current $I_c$ is the input signal into low-noise preamp 322. The circulating current $I_c$ flows through a feedback resistor contained in low-noise preamp 322, producing a significant amount of gain, thereby noiselessly amplifying the current signal from current transformer 130.

Low-noise preamp 322 is provided to convert the resonated input current into a voltage out from low-noise preamp 322. The input impedance of low-noise preamp 322 is relatively low and, accordingly, the quality factor or "Q" factor for the circuit shown in FIG. 3 is $2\pi wL/Rct$.

Band-pass filter 323 is a filter device that passes frequencies only within a certain range and rejects (attenuates) frequencies outside that range. While the frequency range for band-pass filter 323 is variable and selected based upon a specific application, the most preferred embodiments of the present invention will typically employ a band-pass filter that will pass only frequencies slightly above and slightly below the desired frequency, while blocking all others. Accordingly, with a desired frequency of 2 Hz, band-pass filter 323 would be designed to pass any frequency in the approximate range of 1.5 Hz to 2.5 Hz range and screen out any signals operating in a frequency outside that range. Similarly, when low frequency button 126 of FIG. 1 is depressed, band-pass filter is configured to pass frequencies in the range of approximately 0.5 Hz only. In this fashion, band-pass filter 323 is designed to remove signal spikes and spurious noise that would otherwise interfere with the operation of LED 124, particularly those signals that would create a "false positive" signal. Those skilled in the art will recognize that the range of frequencies can be expanded or contracted to ensure that only the desired frequency range is passed by band-pass filter 323. Band-pass filter 323 is considered an important element for the most preferred embodiments of the present invention since it will allow location of ground fault currents using a current transformer. While most current transformers can be used to monitor oscillations, known current transformers have a minimum response frequency of approximately 30 Hz. If the ground current were to be oscillated at 30 Hz, thereby allowing detection by a standard current transformer, the capacitive reactance of long cable runs, coupled with additional capacitance introduced due to intentional grounding, false positives would render the device impractical and inefficient for locating ground fault currents.

Bias voltage floating ground 324 provides a single supply low impedance point to simulate a ground connection. This creates reference voltage and enables the use of a single supply voltage 320 in conjunction with bias voltage floating ground 324 for troubleshooting a circuit for ground faults.

Diode 325 acts as a "check valve" and is provided to prevent a negative signal from being introduced into signal level display 123.

Comparator 326 provides the output signal to control the illumination of LED 124. The two input signals for comparator 326 are the output signals from band-pass filter 323 and low-pass filter 327. It should also be noted that comparator 326 employs hysteresis so as to limit the minimum detectable signal for output purposes, thereby ensuring that LED 124 is not activated due to spurious noise in the circuit.

Low-pass filter 327 is a filter that is specifically designed to pass low frequencies, but that will also attenuate (or reduce) frequencies higher than the desired cutoff frequency. The actual amount of attenuation for each frequency varies for each specific application, but the most preferred embodiments of the present invention will employ a low-pass filter 327 that has been designed to have a cutoff frequency in the range of 0.0033 Hz. This will prevent higher level frequencies from entering comparator 326. Low-pass filter 327 may not be necessary in all embodiments of the present invention but for those implementations where an amplified offset voltage in the preamp and filter cause the average DC to be different (by a small amount) from the targeted bias voltage, then low-pass filter 327 may be used to correct the difference.

Additionally, low pass filter 327 will preferably have a cutoff frequency much lower than 2 Hz, so the output of low-pass filter 327 is the average of the output of the bandpass filter 323. When the 2 Hz signal is higher than the average, LED 124 is turned on and when the 2 Hz signal is lower than the average, LED 124 is turned off. The time constant of low-pass filter 327 is approximately 50 seconds. In certain preferred embodiments of the present invention, a "speedup circuit" may be implemented in order to reduce the time for the overall circuit to be usable. The use of speedup circuits to improve the dynamic response for capacitors is well-known to those skilled in the art.

Signal level display 123 provides a visual feedback indicator to inform the operator as to the strength of the signal (typically in milliamps) being monitored by ground fault location sensor 120. Signal level display 123 also provides a visual feedback indicator to inform the operator as to the presence of a current operating in the desired or "tuned" frequency range. In the most preferred embodiments of the present invention, the various components of ground fault location sensor 120 are configured to illuminate cascading LEDs 123 in the presence of a current oscillating at a frequency at or about the target frequency levels. Since there are most preferably 10 LEDs, and one LED is illuminated for each 1.0 mA detected (on the 1× scale), then the illumination of all 10 LEDs will be commensurate with 10.0 mA. The visual indicator is proportional to the magnitude of the current being detected. In the most preferred embodiments of the present invention, this is either 0.5 Hz or 2.0 Hz. Since these are the designated or desired frequencies, when a circuit is oscillating at or about one of these frequencies, the operator has a good indication that the circuit is the source of the ground fault current. This will allow the operator to begin to isolate and/or repair the circuit as necessary. To more closely locate the ground fault, the 2.0 Hz frequency will be used first and then, once an appropriate candidate circuit branch has been located using the 2.0 Hz frequency, the 0.5 Hz frequency will be used to "fine tune" the location of the ground fault. This approach is due to the specific design of the present invention. When intentional noise suppression is provided on a circuit by suppression capacitors connected to ground, with a low enough capacitance, known ground fault sensor will identify the capacitance as a possible ground fault (i.e., a "false positive"). By lowering the frequency of oscillation on a resistive circuit, the current remains the same. However, on a capacitive circuit, the capacitive reactance increases and the current decreases, thereby providing a means to eliminate the false positives due to capacitive paths.

Figure 4:
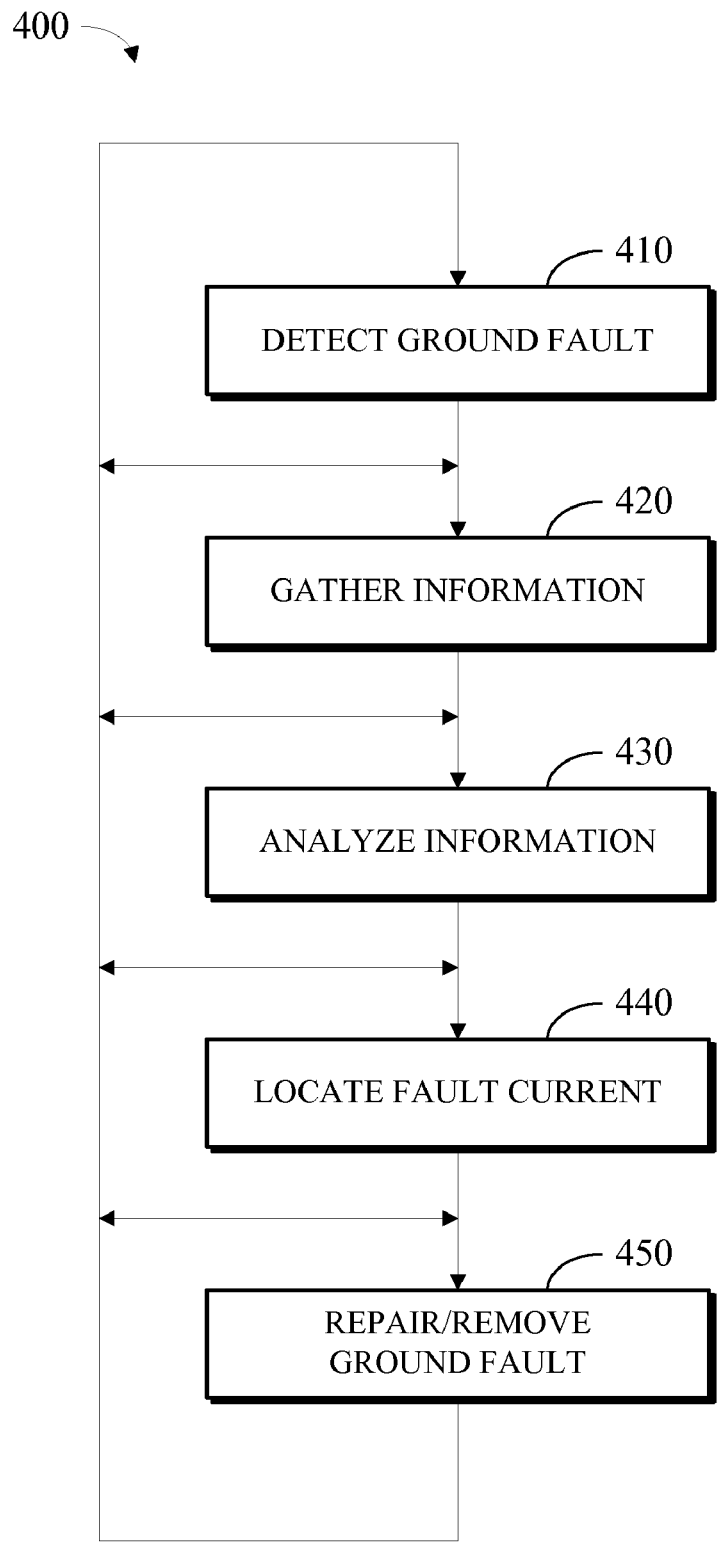
FIG. 4 is a flow chart for a method of detecting, locating, and repairing ground faults in accordance with a preferred embodiment of the present invention.

Referring now to FIG. 4, a method 400 for detecting and locating a ground fault in accordance with a preferred embodiment of the present invention is depicted. As shown in FIG. 4, the first step is to detect a ground fault (step 410). The process of detecting a ground fault in accordance with the most preferred embodiments of the present invention is similar to the techniques presently known to those skilled in the art with the notable difference that the detection can be accomplished by using ground fault main unit 110 of FIG. 1. A ground fault detection circuit, such as that shown in FIG. 2C, will be incorporated into ground fault main unit 110 of FIG. 1 is depicted in FIG. 5.

Next, using the various preferred embodiments of the present invention previously described in conjunction with FIG. 1, FIG. 2, and FIG. 3, additional information about the detected ground fault can be gathered (step 420) in an attempt to locate the most likely source of the ground fault detected in step 410. For example, by incorporating an offset voltmeter between the internal resistors and ground fault main unit 110 of FIG. 1 and FIG. 2, a determination can be made as to whether the ground fault has occurred on the positive or negative side of the circuit, effectively eliminating one half of the circuit and related components from the troubleshooting process.

Next, the information gathered by the various components of apparatus 100 of FIG. 1 may be analyzed (step 430) and used to determine the most probable location for the ground fault detected in step 410 by using the line voltage measurement, offset voltage measurement, and the Thevenin theorem as previously discussed. In the steady state current mode, the CMV output will be raised to a level sufficient to ensure that the ground current is measurable. By observing polarity indicator light 246 of FIG. 2A, additional information can be gleaned. If, when changing modes, polarity indicator light 246 increases in brightness, this would indicate that other paths to ground have been induced by oscillating the ground current (e.g., capacitive paths that could indicate a false positive). However, on the other hand, if no significant difference in the brightness occurs, then spurious ground paths are probably not an issue and can most likely be discounted.

Once the analysis has been completed, one or more technicians may be dispatched to the main switchgear to systematically search each circuit and distribution panel fed from the main switchgear using the current mode (2 Hz) (step 440) to locate the ground fault. The process of locating the ground fault will generally consist of placing one or more current transformer and ground fault location apparatus combinations (not shown this FIG.) over one or more branch circuits in an attempt to verify the location of the ground fault. If the monitored circuit is oscillating at the first target frequency, then the technician can be fairly certain that they have located an appropriate branch circuit that could be considered a candidate for the ground fault. To further solidify and confirm their findings, the technician may switch main unit 110 to the lower 0.5 Hz frequency using switch 252. Then by depressing low frequency button 126 on the ground fault location apparatus 120, temporarily switching the internal band pass circuit to the lower frequency (e.g., 0.5 Hz). If the strength of the detected current signal does not change, then it is highly likely that the branch circuit containing the ground fault has been located. If, on the other hand, a significant change in the signal strength is observed, then it is most likely that that the branch circuit being checked is not the location of the ground fault (e.g., a false positive, most likely due to capacitive reactance). In addition, using the phase mode, the larger the phase angle, the more capacitive reactance there is on the circuit and the more likely it is that a false positive could be generated.

Once the circuit containing the ground fault has been successfully located, the defective circuit or component may be repaired or replaced (step 450). The exact nature of the repair or replacement to be made will be determined by the technician on a case-by-case basis.

Referring now to FIG. 5, a circuit configuration 500 for detecting the presence of ground faults is depicted. A pair of matched resistors 510 are placed in series, (e.g., across the feeder but in parallel to the load) between the positive side 520 and the negative side 530 of circuit 500. Load 560 is operated in parallel with resistors 510 with the center point of resistors 510 being connected to a ground point 550. In normal operation, the voltage across each resistor 510 is equal and is one half of the total voltage supplied to load 560. However, as shown in FIG. 5, with the introduction of a ground fault at point 580, a ground fault current will begin to flow along current path 570. As shown in FIG. 5, the voltage distribution across resistors 510 is now unbalanced. By monitoring the voltage levels across resistors 510, the presence of a ground fault can be detected.

Certain preferred embodiments of the present invention will comprise circuitry for measuring the "offset voltage" in the system by taking certain voltage measurements. An offset voltage measurement is obtained by using the voltmeter functionality of voltmeter 210 of FIG. 2 in the voltmeter mode. The procedure is to remove the intentional ground from the ground detector and then measure the voltage or difference of potential between the center point of matched resistors 510 to ground 550 of FIG. 5. On an ungrounded system that has a ground fault current, this voltage measurement will allow a technician to determine the percentage of the field device where the ground fault has occurred by performing a simple calculation. The polarity of the voltmeter will also indicate whether a ground fault has occurred nearer the positive side from the center of the field device for DC circuits (hot side for AC circuits) or the negative side (common side for AC circuits) of the circuit.

In certain preferred embodiments of the present invention, continuous ground current tracking capabilities may be provided by connecting a standard chart recorder to chart recorder control terminals 280 of FIG. 2 in the ammeter mode. In this fashion, a continuous or substantially continuous ground fault current can be monitored to determine if the magnitude of the ground fault current or location of the field device that the ground fault has occurred at, has changed over time. This will allow for more efficient and effective ground fault analyzing, detecting, and locating.

Similarly, certain preferred embodiments of the present invention will utilize ammeter 218 of FIG. 2 to measure and track ground fault current flow in the ammeter mode of operation. Ground fault current is the flow of current from the field device fault to ground (unintentional ground) to the ground detector intentional ground. This measurement may also be used to determine the strength of the ground fault current.

As previously explained, certain preferred embodiments of the present invention will utilize frequency oscillator 214 to initiate ground fault current oscillation for purposes of locating a ground fault. Ground fault current oscillation is used as a ground fault location technique and is accomplished by changing the steady state current of DC ground fault current to an oscillating current for DC systems or by changing the normal rate of oscillation of AC ground fault current to a slower oscillation rate for AC systems. In the most preferred embodiments of the present invention, the ground fault current will be oscillated at a frequency that is less than 60 hertz. The most preferred embodiments of the present invention provide for at least two separate and distinct oscillation frequencies. The most preferred rates for the faster current oscillation will be the 1 Hz to 10 Hz range, with 2 Hz being the most preferred frequency for locating the ground fault. The most preferred rates for the slower current oscillation will be the 0.25 Hz to 1.5 Hz range, with 0.5 Hz being the most preferred frequency for locating the ground fault.

In certain preferred embodiments of the present invention, ground fault location sensor 120 of FIG. 1 will enable sensing of the ground fault current oscillations. The most preferred embodiments of ground fault location sensor 120 of FIG. 1 comprise circuitry that is designed to accept or pass the frequency that the ground fault current is being oscillated at and to reject or block all other frequencies. Using this technique, ground fault location sensor 120 of FIG. 1 will not inadvertently actuate by detecting random noise frequencies and random frequencies will not interfere with the ground fault location method. Ground fault location sensor 120 of FIG. 1 may also be embodied as a Phase Lock Loop (PLL) circuit design that will enable it to be wireless and independent of ground fault main unit 110 of FIG. 1. The technician can therefore initiate ground fault current oscillation and "freely" move about the suspected circuit and components and attempt to locate the oscillating ground fault current signal. Multiple ground fault location sensor 120 can also be used that are positioned at various locations of an anticipated or suspected circuit fault to ground.

Figure 6:
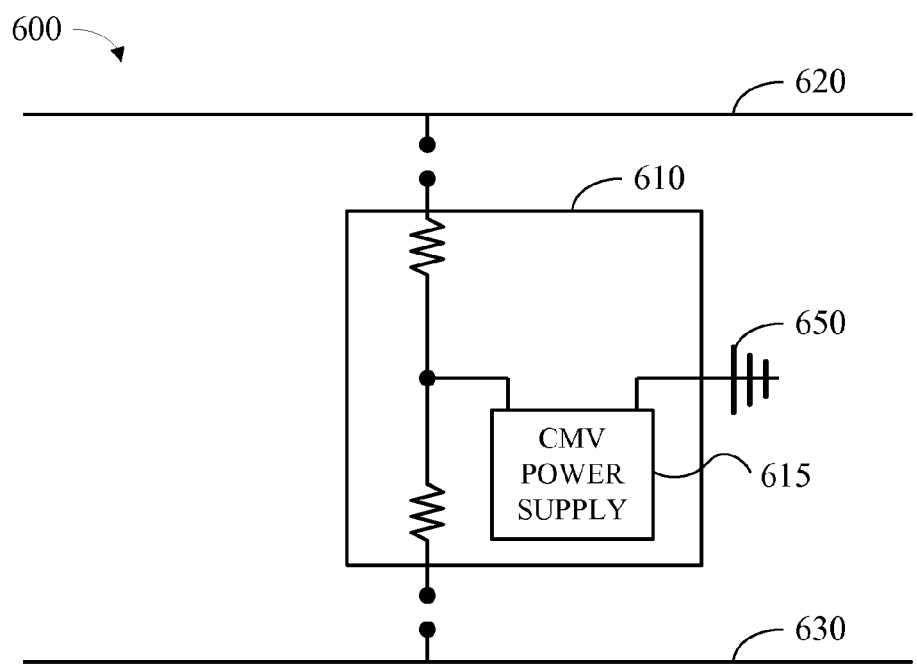
FIG. 6 illustrates a common mode voltage (CMV) circuit connection in accordance with a preferred embodiment of the present invention.

Referring now to FIG. 6, a system 600 for locating ground faults in accordance with a preferred embodiment of the present invention is depicted. As shown in FIG. 6, a ground fault detector unit 610 is positioned between the positive side 620 of the supply system and the negative side 630 of the supply system. Ground fault detector unit 610 includes a CMV power supply 615 that is connected to a ground 650.

In this fashion, system 600 of FIG. 6 is configured to introduce a "common mode voltage" or CMV into the ground fault location process. This embodiment is particularly useful in situation where a ground fault has been detected but the ground fault current is very low due to a very high resistance in the circuit (e.g., fault to ground). In this situation, the oscillations of the ground fault current induced in the system may be too small to detect with the hand-held ground fault location sensor 120 as described in conjunction with FIG. 1 and FIG. 3.

Accordingly, to increase the probability of locating the ground fault, a CMV is introduced into system 600 to raise the voltage across the actual ground resistance and thereby increase the amount of ground fault current that is flowing in the system. The CMV is a voltage introduced into the system by removing the intentional ground from ground fault detector unit 610 and adding a variable voltage source or power supply ground fault detector unit 610 between the center point of ground fault detector unit 610 and the intentional grounding point 650 of ground fault detector unit 610, as shown in FIG. 6. This configuration will raise the ground fault current to a magnitude sufficient that the presence of the ground fault current can be detected by using handheld ground fault detection sensor 120 of FIG. 1.

System 600 may include a ground fault main unit 610 deployed in a permanent configuration, thereby replacing the "normal service" ground detector typically installed in conjunction with the main switchgear.

In this alternative preferred embodiment of the present invention, the permanently mounted ground fault main unit 610 includes at least two contacts to operate a local or remote alarm or both alarms. If a ground fault is detected, the contacts of the detector would remain closed until the ground went away and the local or remote alarm would not be able to reset the alarm until the ground cleared. The ground contacts will most preferably be configured with individual set points to allow for maximum flexibility. Those skilled in the art will recognize that the contacts may be provided in both a "normally open" configuration and a "normally closed" configuration, thereby allowing ground fault main unit 610 to be configured for deployment in a wide variety of systems and applications.

For certain preferred embodiments of the present invention, a more permanent version of apparatus 100 of FIG. 1 will be installed. This preferred embodiment will comprise a microprocessor controlled ground fault main unit 110 that is programmed by the technician and that will not have the buttons, switches, etc. shown in conjunction with FIG. 2A. The permanent embodiment will be microprocessor or CPU based and the required settings to be initially configured by the user. The external chart recorder previously explained may be replaced by the inclusion of an internal event recorder with date, time, source voltage, amount of offset voltage, and ground fault current all being monitored and recorded on a regularly scheduled and user-configurable basis. In this preferred embodiment of the present invention, the data may be analyzed and calculated by the device itself.

Additionally, for the most preferred embodiments of the permanent or semi-permanent installation, branch circuit current transformer modules may be installed at strategic locations in the ungrounded electrical power distribution system. These current transformer modules will be a slightly modified version of current transformer 130 of FIG. 1 with some important modifications and will perform the same type of functionality as current transformer 130 described in conjunction with FIG. 1. Alternatively or additionally, ground fault detection relay units could be strategically placed and installed at certain locations in an ungrounded electrical distribution system, thereby providing a more expeditious locating protocol for identifying ground faults as they occur. Once such detector relay in accordance with a preferred embodiment of the present invention is shown in FIG. 8.

Figure 8:
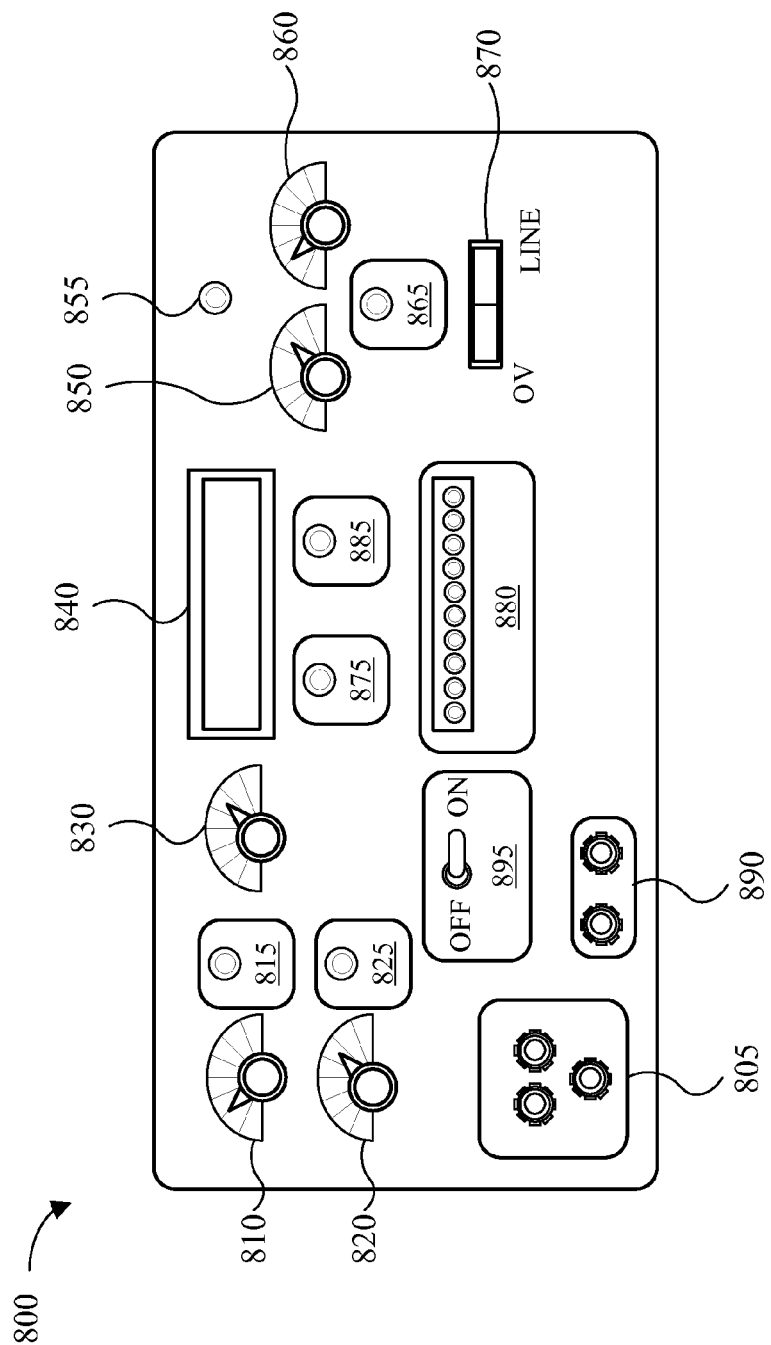
FIG. 8 is block diagram of a detector relay suitable for use in conjunction with a ground fault location apparatus in accordance with a preferred embodiment of the present invention.

Referring now to FIG. 8, a block diagram of the front panel for a detector relay 800 for a ground fault detection and location system in accordance with a preferred embodiment of the present invention includes: connector jacks 805; a first alarm knob 810 with alarm indicator LED 815; a second alarm knob 820 with alarm indicator LED 825; power indicator LED 855; time delay selector knob 830; display 840; under-voltage selector knob 850; under-voltage time selector knob 860; under-voltage indicator LED 865; three-way rocker switch 870; positive ground fault indicator LED 875; negative ground fault indicator 885; LED signal indicator bank 880; voltage output jacks 890; and a detector relay disable switch 895.

In the most preferred embodiments of the present invention, detector relay 800 is connected to a branch circuit or piece of equipment associated with the ungrounded electrical distribution system to be monitored and will monitor the specific location for the presence of ground fault current. The ground fault current can be detected by the use of an internal voltage divider network. As previously discussed in conjunction with FIG. 1, FIG. 2, and FIG. 3, detector relay 800 is comprised of the various components and circuitry necessary to provide the ground fault monitoring function. Detector relay 800 monitors ground current, through the use of an internal voltage divider network. When there is no ground fault current, display 840 will read a nominal 0.0 amps and no alarm or ground fault LEDs will be illuminated. When a ground fault current occurs, the voltage divider network senses an increased voltage (or current) across one of the two resistors and will create an open circuit on the resistor with the lower voltage reading. Display 840 will display the magnitude of the ground fault current and the appropriate alarm and polarity LEDs will be illuminated. When the ground fault is cleared, detector relay 800 will continue to monitor the ground current, which should return to a nominal level of 0.0 amps with no alarm or polarity LEDs illuminated. Using three-way rocker switch 870, a technician can obtain the current reading for either the line voltage or the offset voltage by momentarily depressing three-way rocker switch 870 in the appropriate direction. Additionally, a computer controlled embodiment of the present invention would provide for a period cycle of voltages to be displayed, in turn, using display 840.

Connector jacks 805 are provided to allow various external devices to be connected to detector relay 800. For example, a chart recorder could be connected to detector relay 800 via connector jacks 805. Similarly, ground fault location sensor 120 could be connected to detector relay 800 via connector jacks 805. In this fashion, once a ground fault has been detected by detector relay 800, ground fault location sensor 120 may be used to assist in the diagnostic process to more efficiently and rapidly locate the ground fault.

First alarm knob 810 with alarm indicator LED 815 can be used as a local alarm or warning and is set at a pre-determined threshold for generating an alert for a ground fault current that occurs on the specific branch circuit of the ungrounded electrical distribution system that is being monitored by detector relay 800. The selection range for first alarm knob 810 ranges from 0 mA to 10 mA, which is the most preferred embodiment. If the ground fault current level detected by detector relay 800 exceeds the pre-determined threshold established by alarm knob 810, alarm indicator LED 815 will be illuminated, thereby alerting operations personnel to the ground fault condition. This visual indicator can function as a remote alarm, alerting technicians and other personnel as to the serious nature of the ground fault condition.

As with first alarm knob 810, second alarm knob 820 with alarm indicator LED 825 can be used to set a pre-determined threshold for generating an alert for a ground fault current that occurs on the specific branch circuit of the ungrounded electrical distribution system that is being monitored by detector relay 800. If the ground fault current level detected by detector relay 800 exceeds the pre-determined threshold established by alarm knob 820, alarm indicator LED 825 will be illuminated, thereby alerting operations personnel to the ground fault condition.

In practice, it may be advisable to set the current threshold for alarm knob 810 lower than the current threshold for alarm knob 820. This allows an operator to "bracket" a specific "high alert status" range for ground fault detection. If alarm indicator LED 815 is illuminated but alarm indicator LED 825 is not illuminated, then the approximate range for the ground fault current can be ascertained. Obviously, if both alarm indicator LED 815 and alarm indicator LED 825 are illuminated, then the ground fault current has exceeded both current thresholds.

Power indicator LED 855 is provided to alert the operator of detector relay 800 when detector relay 800 is energized. If power indicator LED 855 is illuminated, then detector relay 800 is energized and can be used for ground fault detection.

Time delay selector knob 830 can be used to select a certain amount of time delay that will allow for a transient ground fault current to be detected without generating an alarm for the threshold established by alarm knob 820. By setting time delay selector knob 830 for a specific time period (e.g., from 0-10 seconds), any ground fault current that is not detected for at least the specified time period will not activate the alarm associated with alarm knob 820, even if the detected ground fault current momentarily exceeds the ground fault current threshold established by alarm knob 820.

Display 840 is provided to offer a visual indication to the operator of detector relay 800 regarding the voltage and current parameters of the specific branch circuit or equipment associated with ungrounded electrical system being monitored by detector relay 800. Since part of the troubleshooting methodology for locating ground faults in accordance with a preferred embodiment of the present invention includes the manipulation of the ground fault current, display 840 can be an important part of the location process. The voltage measurements and current measurements displayed on display 840 provide information that can assist in analyzing the severity of a ground fault and offer insight on possible location of circuits or components causing the ground fault. For example, by utilizing the current and voltage measurements in conjunction with Thevenin's theorem, the Thevenin resistance can be calculated and the point in the field device where the ground fault originates can be calculated as a percentage of the total resistance.

If no ground fault current is detected by detector relay 800, display 840 should read a nominal 0.0 amps and alarm indicator LED 815 and alarm indicator LED 825 will not be illuminated. Additionally, since no ground fault current has been detected, neither positive ground fault indicator LED 875 or negative ground fault indicator LED 885 will be illuminated. However, if a ground fault current is detected by detector relay 800, display 840 will display the magnitude of the ground fault current and either positive ground fault indicator LED 875 or negative ground fault indicator LED 885 will be illuminated, depending on whether the ground fault has occurred on the positive or negative side of the branch circuit being monitored by detector relay 800.

Under-voltage selector knob 850 is provided as a means to select a threshold for detecting under-voltage conditions that may occur on the branch circuit or equipment being monitored by detector relay 800. In the most preferred embodiments of the present invention, the under-voltage threshold will be established as a percentage of the line voltage for the ungrounded electrical system being monitored. The appropriate percentage can be selected using under-voltage selector knob 850. When the voltage level being monitored by detector relay 800 drops below the threshold established by under-voltage selector knob 850, an alarm will be activated and under-voltage indicator LED 865 will be illuminated.

Under-voltage time selector knob 860 is provided as a means to allow for a transient under-voltage condition to occur without generating an alarm by establishing a certain time period for the under-voltage condition (e.g., from 0-10 seconds). If the under-voltage condition is not present on the circuit for at least the time threshold established by under-voltage time selector knob 860, then no alarm will be generated.

Under-voltage indicator LED 865 is illuminated whenever the under-voltage threshold established by under-voltage selector knob 850 (subject to the time limits established by under-voltage time selector knob 860) is exceeded.

Three-way rocker switch 870 provides a quick and easy way for the operator of detector relay 800 to evaluate the offset voltage or line voltage of the branch circuit or equipment being monitored by detector relay 800. Once a ground fault has been detected, the operator can push the rocker switch to the "OV" (for offset voltage) or line volts position at any time and display 840 will display the offset voltage reading or the line voltage reading, depending on which end of three-way rocker switch 870 has been pressed. Once the operator releases three-way rocker switch 870, display 840 will once again display the magnitude of the ground current. In this fashion, the operator could analyze where in the field device the ground fault has occurred by looking at the level of the over-voltage. The operator could also calculate the R Thevenin value of the circuit by using these two values (e.g., R Thevenin=OV/ground current).

If a positive leg ground fault current of significant magnitude is detected by detector relay 800, positive ground fault indicator LED 875 will be illuminated.

If a negative leg ground fault current of significant magnitude is detected by detector relay 800, negative ground fault indicator LED 885 will be illuminated.

LED signal indicator bank 880 is most preferably a bank of LEDs that are used to indicate the magnitude of the ground fault current detected by detector relay 800. The greater the magnitude of the ground fault current, the more LEDs that will be lit up. In the most preferred embodiments of the present invention, each mA of ground fault current detected by detector relay 800 will cause one LED to be illuminated (e.g., a ground fault current with a magnitude of 4 mA would cause 4 LEDs to be illuminated). This provides a visual indicator of the magnitude of the ground fault current and will provide a quick and efficient means of evaluating the severity of the ground fault.

Voltage output jacks 890 provide a voltage output that is proportional to the ground current and can be utilized for connecting a chart recorder to generate visual output regarding the operation of the circuit and associated devices.

Detector relay disable switch 895 is provided to effectively disable the operations of detector relay 800. This feature may be useful in certain troubleshooting situations. Once activated, detector relay disable switch 895 removes the ground connection from detector relay 800 and effectively "hard wires" it to connector jacks 805, this allows detector relay 800 to be removed out of the circuit so the ground fault sensor 120 of FIG. 1 or a chart recorder can be connected to detector relay 800. In this situation, the power to detector relay 800 is switched off and detector relay 800 is effectively de-energized. Even when detector relay 800 has been deactivated by detector relay disable switch 895, output jacks 890 are always "hot" with a ground reference, so that a chart recorder could also be connected to detector relay 800 and used to analyze the circuit. As long as the detector relay ground is not disabled, there will be a voltage proportional to current on the output jacks 890 to be used with the chart recorder.

When detector relay 800 has not been disabled by the use of detector relay disable switch 895, then any attached chart recorder can measure line voltages to ground from output jacks 805 and measure ground current from connector jacks 805. Detector relay 800 remains "in service" and all LEDs and display 840 remain illuminated and functional, depending on the status of the ground current. This will allow connector jacks 805 to serve as "relay testing jacks", so that an operator can connect a variable resistance from a leg of the circuit to ground and test the functionality of detector relay 800.

Once detector relay 800 has been disabled by the use of detector relay disable switch 895, then any chart recorder connected to output jacks 890 will read line voltages and the ground current can be manipulated, resistances can be added or similar diagnostic procedures can be conducted. Ground fault location sensor 120 of FIG. 1 can be connected in this configuration. With detector relay 800 "out of service," all LEDs and display 840 are no longer operational or illuminated. Should detector relay 800 suffer a catastrophic fault, detector relay 800 automatically shuts down and a set of contacts on the rear of the unit (not shown this FIG.) will send an alarm to a central monitoring location. Those skilled in the art will recognize that appropriate input and output connections will be integrated into detector relay 800 so as to allow for optimal connection to circuits and other devices, as necessary to operate as described herein.

The use of a detector relay 800 in accordance with a preferred embodiment of the present invention is more versatile than previously known ground fault detection and location systems. By providing a means for the locating equipment to connect directly to detector relay 800, instead of clipping power leads on busses or breakers etc., a more direct and efficient diagnostic process can be conducted. Additionally, since many stations are using chart recorders to analyze their systems now, detector relay 800 provides a means to quickly and easily connect a chart recorder to the desired location. Detector relay 800 also provides the information needed to analyze a ground fault through the use of offset volts and ground current readings. Additionally, LEDs 880 provides a clear visual indication of how serious the ground fault may be. Finally, the inclusion of time delays for alarms will reduce or eliminate "false alarms."

Those skilled in the art will recognize that the specific representations presented in conjunction with the description of FIG. 800 are merely illustrative in nature and are not limiting or exhaustive. Additionally, the exact placement, size shape, etc. of the controls depicted in FIG. 800 are not to be interpreted as limiting in nature but serve as examples of one specific preferred embodiment of the present invention. Accordingly, many deviations for preferred exemplary embodiment shown in FIG. 800 are contemplated as being within the scope of the present invention. For example, it is anticipated that certain preferred embodiments of the present invention may replace switches with levers, meters with gauges, buttons with switches, etc. Any such substitutions are encompassed within the scope of the various preferred embodiments of the present invention. Additionally, it is anticipated that a touch screen display may be utilized with a programmatic user interface incorporating electronic versions of display 840 and the various knobs, buttons, and switches. This would allow for rapid and flexible deployment of new features.

In a permanent installation of at least one preferred embodiment of the present invention, in addition to the ground fault detection function incorporated into ground fault detection and location apparatus 100 of FIG. 1, certain other functions may be included. For example, in at least some preferred embodiments of the present invention, an under voltage detection system, and/or an overvoltage detection system, and/or a time delay alarm system may also be incorporated into ground fault detection and location apparatus 100 of FIG. 1. These various protection systems will be connected to alarm contacts, thereby providing for the activation of one or more alarms or voltage disconnect relays, based on certain predetermined conditions.

For example, a given mechanical production system may suffer catastrophic failure should the supply voltage for the equipment reach a certain voltage level, whether that voltage level is above or below the optimal voltage level. For those applications, the ability to generate an alarm based on reaching a pre-selected voltage threshold can provide a valuable early warning system and possibly avert a serious system failure. Accordingly, in addition to providing the ability to detect and locate ground faults, ground fault detection and location apparatus 100 of FIG. 1 and FIG. 2 may incorporate a series of alarm contacts that can be actuated when the source voltage goes below or above a user-selectable value. The time delay feature can be utilized in conjunction with the under voltage and over voltage to delay the activation of the alarm for a short period of time, enabling ground fault detection and location apparatus 100 of FIG. 1 and FIG. 2 to verify that a true out-of-range voltage situation has occurred, thereby insulating the alarm system from a transitory spike that may be detected on a momentary basis.

With a more permanent installation, multiple current transformers, such as those previously described in conjunction with FIG. 1, may be employed to provide a continuous monitoring environment for multiple branch circuits, a portable and transportable embodiment may also be deployed. In this embodiment, the current transformers will typically be "clip-on" or "clamp-on" current transformers, such as current transformer 730 of FIG. 7. This configuration allows one or more current transformers to be installed without de-energizing the branch circuits at the time of installation. These various alternative preferred embodiments of the present invention are designed to allow the operators of an ungrounded electrical system to utilize as many clip-on current transformer detectors as desired, monitoring as many branch circuits as necessary or desired.

While the preferred embodiments of the present invention have been described in the context of a single phase ungrounded A/C system, those skilled in the art will recognize that the various preferred embodiments of the present invention may be adapted for use in conjunction with 3-phase ungrounded A/C systems as well. In the case of a 3-phase ungrounded A/C system, the built-in voltage divider will comprise a "wye" configuration of three resistors with the connection to ground being located at the junction of the three resistors.

Additionally, the preferred embodiments of the present invention may be configured for use in conjunction with ungrounded A/C distributions systems of many different frequencies, or even variable frequency systems that incorporate variable frequency drive motors. In this case, the most preferred embodiment simply utilizes one or more filters to screen out all but the desired test frequency. Those skilled in the art will recognize that while devices such as current transformers are well known in the art, the use of differential or residual current transformers, coupled with the oscillation of a target frequency to locate a ground fault make the various preferred embodiments of the present invention unique. Additionally, the novel methods and approaches set forth herein to overcome the limitations of traditional techniques to address the problems associated with capacitive ground coupling, along with the concurrent use of noise-masking filters, are also unique to the present invention.

As discussed herein, the various preferred embodiments of the present invention embrace systems and methods for locating one or more ground fault in an ungrounded electrical distribution system. More particularly, the present invention relates to systems and methods for locating ground faults in an ungrounded AC or DC system without de-energizing the system, and enabling isolation of the grounded component of the circuit. Lastly, it should be appreciated that the illustrated embodiments are preferred exemplary embodiments only, and are not intended to limit the scope, applicability, or configuration of the present invention in any way. Rather, the foregoing detailed description provides those skilled in the art with a convenient road map for implementing one or more preferred exemplary embodiments of the present invention. For example, the electrical distribution systems described herein may refer to either alternating current (AC) systems or direct current (DC) systems. Similarly, whether the AC system operates at 60 hertz (American system) or 50 Hertz (European system) the apparatus and methods described herein are applicable. Accordingly, it should be understood that various changes may be made in the function and arrangement of elements described in the exemplary preferred embodiments without departing from the spirit and scope of the present invention as set forth in the appended claims.

The invention claimed is:

1. A ground fault detection and location apparatus comprising:
    a ground fault main unit, said ground fault main unit comprising a frequency generator, said frequency generator oscillating a ground current in a normally ungrounded circuit at a first pre-determined target frequency and at a second pre-determined target frequency;
    a ground fault location sensor;
    a current transformer, said current transformer comprising a clip-on jaw, said clip-on jaw being placed around at least one energized positively charged wire and at least one negatively charged wire, said clip-on-jaw substantially encircling said at least one energized positively charged wire and at least one negatively charged wire, said current transformer being selectively coupled to said ground fault location sensor, said current transformer monitoring said oscillating ground current and locating a ground fault by detecting said first target frequency and said second target frequency.

2. The ground fault detection and location apparatus of claim 1 wherein said first target frequency is in the range of 1.5 Hz to 2.5 Hz and said second target frequency is in the range of 0.25 Hz to 1.0 Hz.

3. The ground fault detection and location apparatus of claim 1 wherein said first target frequency is equal to 2.0 Hz and said second target frequency is equal to 0.5 Hz.

4. The ground fault detection and location apparatus of claim 1 wherein said ground fault location sensor comprises a low frequency button, said low frequency button being configured, when momentarily depressed, to allow said ground fault location sensor to identify said second target frequency and not said first target frequency.

5. The ground fault detection and location apparatus of claim 1 wherein said ground fault location sensor further comprises a band pass filter, said band pass filter being configured to selectively screen out a plurality of frequencies that are not said first target frequency or said second target frequency.

6. The ground fault detection and location apparatus of claim 1 further comprising a detector relay, said detector relay comprising:
   a first alarm knob;
   a second alarm knob;
   a time delay selector knob;
   an under-voltage selector knob;
   an under-voltage time selector knob;
   a three-way rocker switch;
   a positive ground fault indicator; and
   a negative ground fault indicator.

7. The ground fault detection and location apparatus of claim 1 wherein said ground fault location sensor further comprises a plurality of input jacks, said plurality of input jacks being sized and configured to accept at least one probe lead from a current transformer.

8. The ground fault detection and location apparatus of claim 1 wherein said ground fault location sensor further comprises:
   a frequency indicator, said frequency indicator being configured to provide a visual indication whenever said target frequency is detected by said current transformer;
   a remote control switch, said remote control switch being configured to temporarily disable said oscillating ground current; and
   a signal strength indicator, said signal strength indicator being configured to provide an indication of the strength of said oscillating ground current.

9. The ground fault detection and location apparatus of claim 1 wherein said ground fault location sensor comprises:
   a bandpass filter coupled to a low-noise pre-amp;
   a bias floating ground coupled to a resonating capacitor and a bandpass filter;
   a diode coupled to said bias floating ground;
   a signal level display coupled to said diode;
   a comparator with hysterisis coupled to said bandpass filter;
   a low pass filter coupled to said bandpass filter and said comparator with hysterisis; and
   an internal power supply, said internal power supply being configured to supply power for said ground fault location sensor.

* * * * *